(12) United States Patent
Wan et al.

(10) Patent No.: US 12,253,778 B2
(45) Date of Patent: Mar. 18, 2025

(54) DISPLAY PANEL, CIRCUIT BOARD AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Bin Wan, Beijing (CN); Xun Pu, Beijing (CN); Xiaoyuan Wang, Beijing (CN); Junming Chen, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/261,879

(22) PCT Filed: Aug. 30, 2022

(86) PCT No.: PCT/CN2022/115770
§ 371 (c)(1),
(2) Date: Jul. 18, 2023

(87) PCT Pub. No.: WO2024/044946
PCT Pub. Date: Mar. 7, 2024

(65) Prior Publication Data
US 2024/0393649 A1    Nov. 28, 2024

(51) Int. Cl.
*G02F 1/1345*    (2006.01)
*G02F 1/1362*    (2006.01)

(52) U.S. Cl.
CPC .. *G02F 1/136286* (2013.01); *G02F 1/136204* (2013.01)

(58) Field of Classification Search
None
See application file for complete search history.

(56) References Cited

U.S. PATENT DOCUMENTS

| | | | |
|---|---|---|---|
| 8,791,478 B2 | 7/2014 | Jeong et al. |
| 9,791,751 B2 | 10/2017 | Zhao |
| 9,933,677 B2 | 4/2018 | Nakamura |
| 9,972,252 B2 | 5/2018 | Choi et al. |
| 10,088,721 B2 | 10/2018 | Ha |
| 11,048,132 B2 | 6/2021 | Jian et al. |

(Continued)

FOREIGN PATENT DOCUMENTS

| | | | |
|---|---|---|---|
| CN | 101206845 A | 6/2008 |
| CN | 103207486 A | 7/2013 |

(Continued)

*Primary Examiner* — Thanh Nhan P Nguyen
(74) *Attorney, Agent, or Firm* — Dilworth & Barrese, LLP.; Michael J. Musella, Esq.

(57) ABSTRACT

A display panel, a circuit board and a display device are provided. The display panel includes a first pad region including a first pad connected to a first integrated circuit, a second pad region including a second pad electrically connected to a second integrated circuit, a third pad region including third pads electrically connected to a circuit board and a common signal line electrically connected to the common electrode of the sub-pixel. The display panel further includes a first signal line and a second signal line, the first pad is electrically connected to the third pad through the first signal line, the second pad is electrically connected to the third pad through the second signal line; the first signal line and the second signal line are electrically connected to each other through the third pads and the circuit board.

20 Claims, 11 Drawing Sheets

(56) References Cited

U.S. PATENT DOCUMENTS

| | | |
|---|---|---|
| 11,520,195 B2 | 12/2022 | Yang |
| 2001/0015709 A1 | 8/2001 | Imajo et al. |
| 2003/0193056 A1 | 10/2003 | Takayama et al. |
| 2008/0143660 A1 | 6/2008 | Itou |
| 2010/0053056 A1* | 3/2010 | Lee .................. G02F 1/1345 345/94 |
| 2012/0211772 A1 | 8/2012 | Moh et al. |
| 2013/0265513 A1* | 10/2013 | Ogasawara ........ G02F 1/1345 438/30 |
| 2023/0052091 A1 | 2/2023 | Xu et al. |

FOREIGN PATENT DOCUMENTS

| | | |
|---|---|---|
| CN | 103811519 A | 5/2014 |
| CN | 103995370 A | 8/2014 |
| CN | 104280954 A | 1/2015 |
| CN | 105629600 A | 6/2016 |
| CN | 106773387 A | 5/2017 |
| CN | 106816135 A | 6/2017 |
| CN | 107037637 A | 8/2017 |
| CN | 107103869 A | 8/2017 |
| CN | 110221462 A | 9/2019 |
| CN | 111383554 A | 7/2020 |
| CN | 111430368 A | 7/2020 |
| CN | 112102725 A | 12/2020 |
| CN | 112748613 A | 5/2021 |
| CN | 113380656 A | 9/2021 |
| CN | 114677987 A | 6/2022 |
| KR | 1020040000978 A | 1/2004 |
| KR | 1020120048083 A | 5/2012 |
| KR | 1020140098937 A | 8/2014 |
| TW | I331743 B | 10/2010 |

* cited by examiner

DISPLAY PANEL, CIRCUIT BOARD AND DISPLAY DEVICE

TECHNICAL FIELD

Embodiments of the present disclosure relate to a display panel, a circuit board and a display device.

BACKGROUND

With the development of information technology, display devices are widely used in people's daily life, and the liquid crystal display, as one of the most widely used flat panel displays, occupies an important position in display devices. In some display screen products, such as industrial control display screen products, a synchronization signal line is connected between two integrated circuits (IC) to enable that the two integrated circuits are cascaded with each other to achieve signal synchronization.

SUMMARY

At least one embodiment of the disclosure provides a display panel, a circuit board and a display device.

An embodiment of the present disclosure provides a display panel, which includes a base substrate including a display region and a peripheral region; a plurality of sub-pixels located in the display region and a first pad region, a second pad region, a third pad region and a common signal line located in the peripheral region. The first pad region includes at least one first pad, the at least one first pad is configured to be electrically connected to a first integrated circuit; the second pad region includes at least one second pad, the at least one second pad is configured to be electrically connected to a second integrated circuit; the third pad region includes a plurality of third pads, the plurality of third pads are configured to be electrically connected to a circuit board, and the third pad region is located on a side of the first pad region and the second pad region away from the display region; the plurality of sub-pixels includes a common electrode, the common signal line is electrically connected to the common electrode and extends along a first direction, the first pad region and the second pad region are located on both sides of the common signal line in a second direction, and the first direction intersects with the second direction. The display panel further includes at least one first signal line and at least one second signal line, the at least one first pad is electrically connected to a first portion of the plurality of third pads through the at least one first signal line, the at least one second pad is electrically connected to a second portion of the plurality of third pads through the at least one second signal line, and the common signal line is electrically connected to an output terminal of the circuit board through a third portion of the plurality of third pads; and the at least one first signal line and the at least one second signal line are configured to be electrically connected to each other through the circuit board and the third pads.

For example, according to an embodiment of the present disclosure, in a direction perpendicular to the base substrate, both the at least one first signal line and the at least one second signal line do not overlap with the common signal line.

For example, according to an embodiment of the present disclosure, a signal configured to be transmitted on a first signal line and a signal configured to be transmitted on a second signal line corresponding to the first signal line are the same signal, and the same signal includes at least one of a synchronization signal and a gamma signal.

For example, according to an embodiment of the present disclosure, at least one kind of the at least one first signal line and the at least one second signal line is provided in the same layer as the common signal line and is insulated from the common signal line.

For example, according to an embodiment of the present disclosure, at least one signal line of the at least one first signal line and the at least one second signal line includes a signal line portion extending along the second direction and a signal line portion extending along a third direction, a line width of the signal line portion extending along the second direction is smaller than a line width of the signal line portion extending along the third direction, and both the first direction and the second direction intersect with the third direction.

For example, according to an embodiment of the present disclosure, a first dummy structure group is provided between the common signal line and at least one kind of the at least one first signal line and the at least one second signal line; and a straight line extending along the second direction passes through orthographic projections of at least one kind of signal line of the at least one first signal line and the at least one second signal line, the first dummy structure group, and the common signal line on the base substrate.

For example, according to an embodiment of the present disclosure, in a direction perpendicular to the base substrate, all of the first signal line, the second signal line and the common signal line do not overlap with the first dummy structure group.

For example, according to an embodiment of the present disclosure, the first dummy structure group includes a plurality of first dummy structure rows arranged along the first direction, and each first dummy structure row includes a plurality of first dummy structures arranged along the second direction.

For example, according to an embodiment of the present disclosure, a maximum length of a portion of at least one kind of the at least one first signal line and the at least one second signal line extending along the second direction is smaller than a maximum dimension of the first dummy structure group in the second direction.

For example, according to an embodiment of the present disclosure, a plurality of first dummy pads is provided between the third pad electrically connected to the common signal line and the third pad electrically connected to the first signal line, and provided between the third pad electrically connected to the common signal line and the third pad electrically connected to the second signal line.

For example, according to an embodiment of the present disclosure, the display panel further includes: a plurality of signal transmission lines, electrically connected to at least part of the plurality of sub-pixels; a fourth pad region, located on a side of the first pad region away from the common signal line and including a plurality of fourth pads, the plurality of fourth pads being configured to electrically connect an output terminal of the first integrated circuit to at least part of the plurality of signal transmission lines; and a fifth pad region, located on a side of the second pad region away from the common signal line and including a plurality of fifth pads, the plurality of fifth pads being configured to electrically connect an output terminal of the second integrated circuit to at least part of the plurality of signal transmission lines. A fourth portion of the plurality of third pads is configured to electrically connect an input terminal of the first integrated circuit to the output terminal of the circuit board, and a fifth portion of the plurality of third pads is configured to electrically connect an input terminal of the second integrated circuit to the output terminal of the circuit board.

For example, according to an embodiment of the present disclosure, the plurality of signal transmission lines include a data line.

For example, according to an embodiment of the present disclosure, the display panel further includes: a plurality of connection lines, located in the peripheral region and configured to electrically connect at least part of the signal transmission lines to the plurality of fourth pads, and electrically connect at least part of the signal transmission lines to the plurality of fifth pads. A part of the plurality of connection lines connected to the plurality of fourth pads forms a first fanout region, a part of the plurality of connection lines connected to the plurality of fifth pads forms a second fanout region, and the common signal line, the first signal line and the second signal line are all located between the first fanout region and the second fanout region.

For example, according to an embodiment of the present disclosure, the display panel further includes an electrostatic discharge structure, the electrostatic discharge structure is electrically connected to the connection line, and the electrostatic discharge structure is located between the signal transmission line and the first pad region and between the signal transmission line and the second pad region.

For example, according to an embodiment of the present disclosure, the plurality of fourth pads and the plurality of fifth pads both include a plurality of first signal output pads and a plurality of second signal output pads, and the plurality of first signal output pads and the plurality of second signal output pads are located in different layers; and the plurality of first signal output pads and the plurality of second signal output pads are arranged in a plurality of rows of output pad rows, each row of the output pad rows includes the first signal output pads and the second signal output pads arranged alternately along the second direction, and adjacent rows of output pad rows are offset with respect to each other in the second direction.

For example, according to an embodiment of the present disclosure, the plurality of connection lines includes a plurality of first connection lines electrically connected to the plurality of first signal output pads and a plurality of second connection lines electrically connected to the plurality of second signal output pads, the plurality of first connection lines is provided in the same layer as the plurality of first signal output pads, the plurality of second connection lines is provided in the same layer as the plurality of second signal output pads, and the plurality of first connection lines and the plurality of second connection lines are arranged alternately along the second direction.

For example, according to an embodiment of the present disclosure, a second dummy structure group is provided between the first dummy structure group and the display region; and a straight line extending along the second direction passes through orthographic projections of the second dummy structure group and the common signal line on the base substrate, and the straight line does not pass through orthographic projections of the first signal line and the second signal line on the base substrate.

For example, according to an embodiment of the present disclosure, the second dummy structure group includes a plurality of second dummy structure rows arranged along the first direction, and each second dummy structure row includes a plurality of second dummy structures arranged along the second direction.

For example, according to an embodiment of the present disclosure, the at least one first signal line and the at least one second signal line are distributed symmetrically relative to a straight line located between the first pad region and the second pad region and extending along the first direction.

For example, according to an embodiment of the present disclosure, the common signal line includes a hollow portion.

For example, according to an embodiment of the present disclosure, the common signal line is electrically connected to at least one third pad, each first signal line is electrically connected to one third pad, and each second signal line is electrically connected to one third pad.

For example, according to an embodiment of the present disclosure, the first pad region further includes at least one second dummy pad, and the second pad region further includes at least one third dummy pad.

An embodiment of the present disclosure further provides circuit board, which includes a first pin region, a second pin region and a third pin region arranged along a first direction, the second pin region and the third pin region being located on both sides of the first pin region, and each pin region includes a plurality of pins. The circuit board further includes at least one connection lead, and at least one pin in the second pin region is electrically connected to at least one pin in the third pin region through the at least one connection lead.

For example, according to an embodiment of the present disclosure, the connection lead is configured to transmit at least one of a synchronization signal and a gamma signal.

For example, according to an embodiment of the present disclosure, the connection lead is distributed symmetrically relative to the first pin region.

An embodiment of the present disclosure further provides a display device, which includes a display panel as mentioned above; and a circuit board. The circuit board includes at least one connection lead, and a first pin region, a second pin region and a third pin region arranged along the second direction, the second pin region and the third pin region are located on both sides of the first pin region, and each pin region includes a plurality of first pins; at least one first pin in the second pin region is electrically connected to at least one first pin in the third pin region through the at least one connection lead. The first portion of the third pads is bound to the first pin of the first pin region, the second portion of the third pads is bound to the first pin of the second pin region, and a third portion of the third pad is bound to the first pin of the first pin region.

For example, according to an embodiment of the present disclosure, the display device further includes: a first integrated circuit, including at least one second pin; and a second integrated circuit, including at least one third pin. The at least one second pin is bound to the at least one first pad, and the at least one third pin is bound to the at least one second pad.

BRIEF DESCRIPTION OF DRAWINGS

In order to clearly illustrate the technical solutions of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the disclosure.

Unless otherwise defined, all the technical and scientific terms used in the present disclosure have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Features such as "parallel", "perpendicular" and "identical" used in the embodiments of the present disclosure include features such as "parallel", "perpendicular" and "identical" in the strict sense, as well as "approximately parallel", "approximately perpendicular" and "approximately identical" and other situations that contain certain errors. Considering the measurement and errors associated with a specific amount of measurement (for example, the limitation of the measurement system), the measurement is represented within an acceptable deviation range for specific values determined by those skilled in the art. For example, "approximately" can mean within one or more standard deviations, or within 10% or 5% of the value. In the case where the amount of a component is not specifically indicated below in the embodiments of the present disclosure, it means that the component may be one or more, or may be understood as at least one. "At least one" means one or more, and "plurality" means at least two. The feature "provided in the same layer" described in the present disclosure refers to two (or more than two) structures, which are provided in the same layer, are formed by the same deposition process and patterned by the same patterning process, and materials of the two structures are the same or different. The "integral structure" in the present disclosure refers to two (or more than two) structures, which are integrated, are formed by the same deposition process and patterned by the same patterning process and are connected to each other, and materials of the two structures are the same or different.

Figure 1:
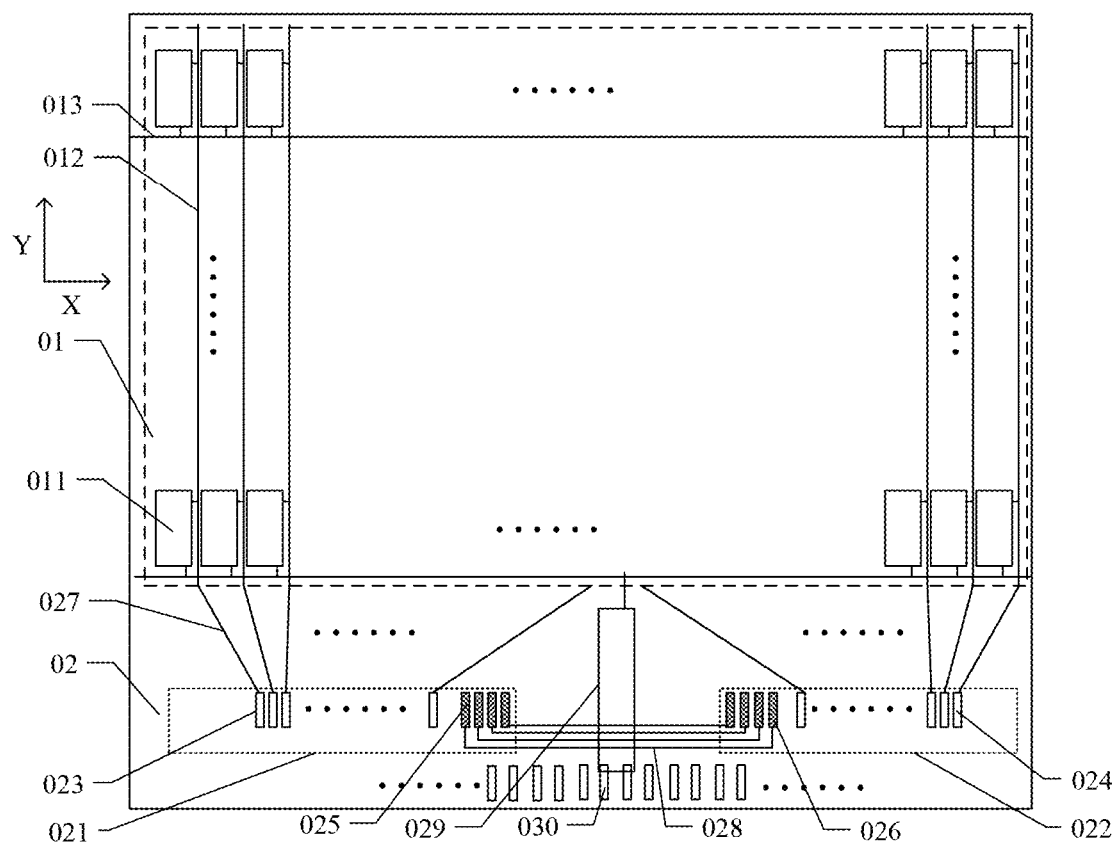
FIG. 1 is a schematic view of a partial planar structure of a display panel.

FIG. 1 is a schematic view of a partial planar structure of a display panel. As illustrated in FIG. 1, the display panel includes a display region 01 and a peripheral region 02 located around the display region 01. The display region 01 includes a plurality of sub-pixels 011 and data lines 012 and gate lines 013 electrically connected to the sub-pixels 011. The peripheral region 02 includes a pad region 021 and a pad region 022, and pads in the pad region 021 and pads in the pad region 022 are respectively electrically connected to different integrated circuits (IC). The pad region 021 includes pads 023 electrically connected to the data lines 012 and pads 025 electrically connected to synchronization signal lines 028, and the pad region 022 includes pads 024 electrically connected to the data lines 012 and pads 026 electrically connected to the synchronization signal lines 028. The data lines 012 are electrically connected to corresponding pads through connection lines 027, and the connection lines 027 form a fanout region. The connection lines 027 electrically connected to the pads in the two pad regions 021 and 022 form two fanout regions. The pads 025 in the pad region 021 are electrically connected to the pads 026 in the pad region 022 through the synchronization signal lines 028 to achieve the synchronization of signals on integrated circuits electrically connected to the pads of the two pad regions 021 and 022, respectively. The sub-pixel 011 includes a common electrode. In order to ensure the stability of the common electrode inside the display panel, the display panel is further provided with a common signal line 029 electrically connected to the common electrode and located in the peripheral region 02. This common signal line 029 is electrically connected to a common electrode line surrounding the display region, and the common signal line 029 is electrically connected to a circuit board through a pad 030, for example, the common signal line 029 is electrically connected to pins provided in a middle region of a flexible circuit board (FPC) through the pad 030, and the common signal line 029 is located between the two fanout regions.

In research, the inventor(s) of the present application found that the common signal line 029 connecting the common electrode line and the flexible circuit board crosses the synchronization signal lines 028 connecting the two integrated circuits. For example, in a general display device, the synchronization signal lines connected between two integrated circuits are made of the same metal layer as the gate lines, and the total number of the synchronization signal lines is large, such as more than 10. The common signal line is made of the same metal layer as the data lines, and the common signal line needs to cross all the synchronization signal lines and be electrically connected to the corresponding pad of the flexible circuit board. In the manufacturing process of the display panel, because of the existence of static electricity, electrostatic discharge (ESD) breakdown is likely to occur at overlapping positions of the common signal line and the synchronization signal lines (such as long wires), thus causing a short circuit between the synchronization signal line and the common signal line, and causing the display panel to display abnormally.

The present disclosure provides a display panel, a circuit board and a display device. The display panel includes a base substrate including a display region and a peripheral region. The display panel further includes a first pad region, a second pad region, a third pad region, and a common signal line located in the peripheral region, and a plurality of sub-pixels located in the display region. The first pad region includes at least one first pad, and the at least one first pad is configured to be electrically connected to a first integrated circuit; the second pad region includes at least one second pad, and the at least one second pad is configured to be electrically connected to a second integrated circuit; the third pad region includes a plurality of third pads, the plurality of third pads are configured to be electrically connected to a circuit board, and the third pad region is located on a side of the first pad region and the second pad region away from the display region; at least part of the sub-pixels include a common electrode; the common signal line is electrically connected to the common electrode, the common signal line extends along a first direction, the first pad region and the second pad region are located on both sides of the common signal line in a second direction, and the first direction intersects with the second direction. The display panel further includes at least one first signal line and at least one second signal line, the at least one first pad is electrically connected to a first portion of the plurality of third pads through the at least one first signal line, the at least one second pad is electrically connected to a second portion of the plurality of third pads through the at least one second signal line, and the common signal line is electrically connected to an output terminal of the circuit board through a third portion of the plurality of third pads; the at least one first signal line and the at least one second signal line are configured to be electrically connected to each other through the circuit board and the third pads.

In the display panel provided by the present disclosure, the first signal line and the second signal line are electrically connected to each other through the third pad and the circuit board, thereby avoiding the electrostatic breakdown between the first signal line and the common signal line, and between the second signal line and the common signal line.

The display panel, circuit board and display device provided by the embodiments of the present disclosure will be described below with reference to the drawings.

Figure 2:
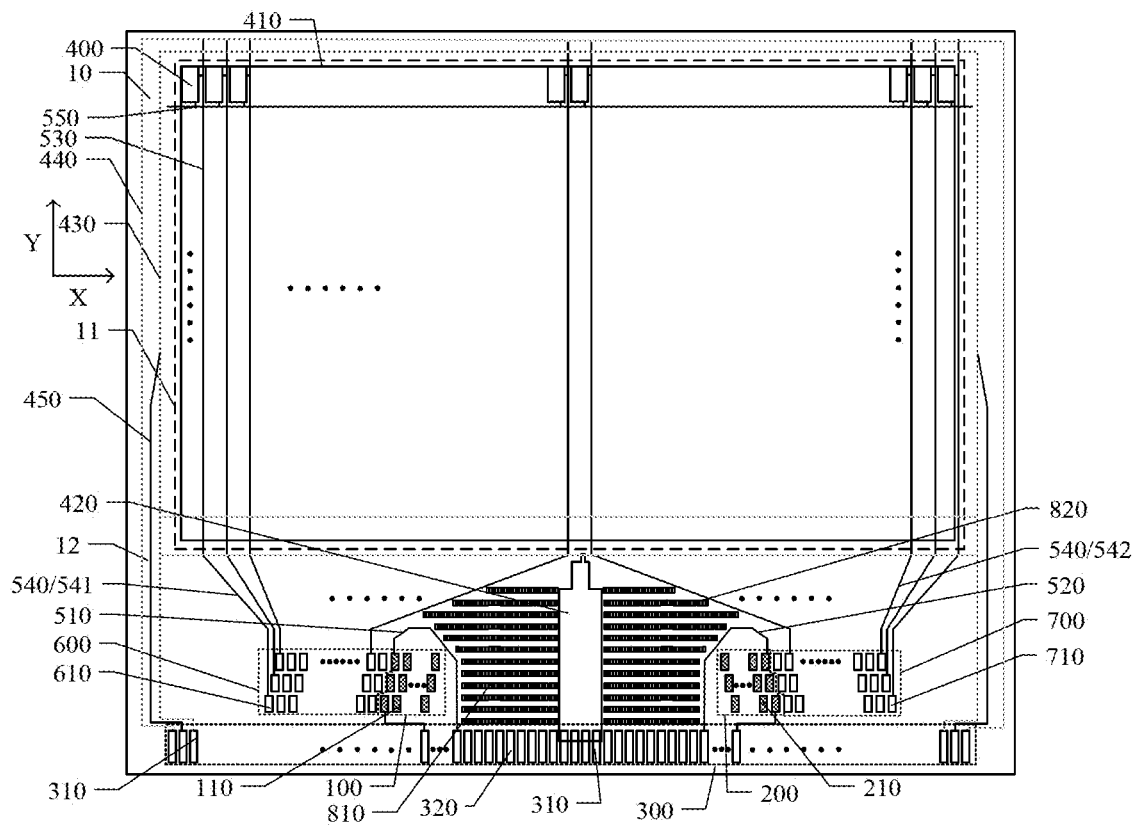
FIG. 2 is a schematic view of a partial planar structure of a display panel according to an embodiment of the present disclosure.
Figure 3:
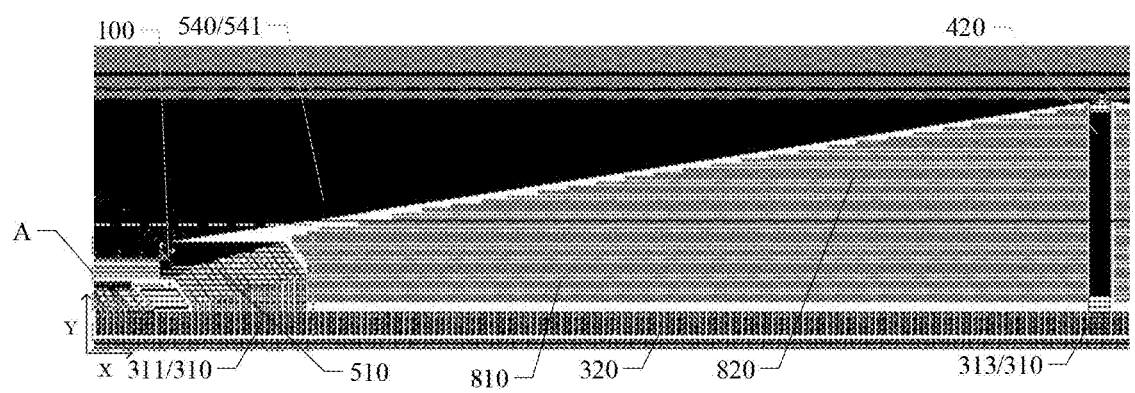
FIG. 3 is an enlarged view of a region in a peripheral region illustrated in FIG. 2.
Figure 4:
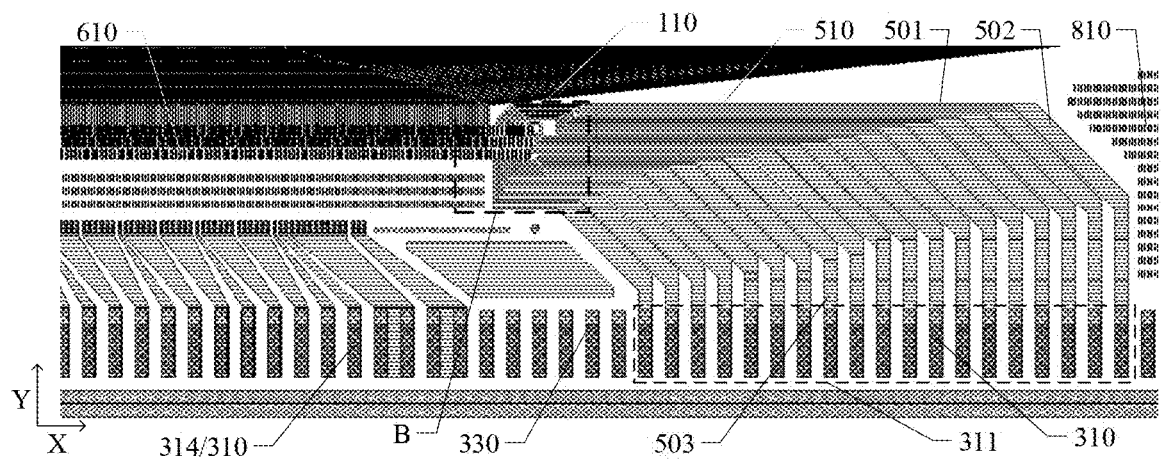
FIG. 4 is an enlarged view of a region A illustrated in FIG. 3.
Figure 5:
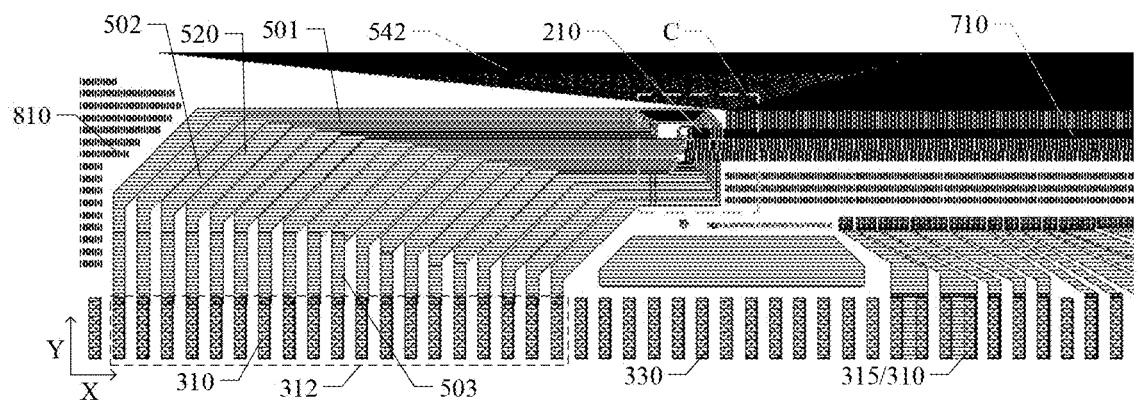
FIG. 5 is an enlarged view of another region in the peripheral region illustrated in FIG. 2.
Figure 6:
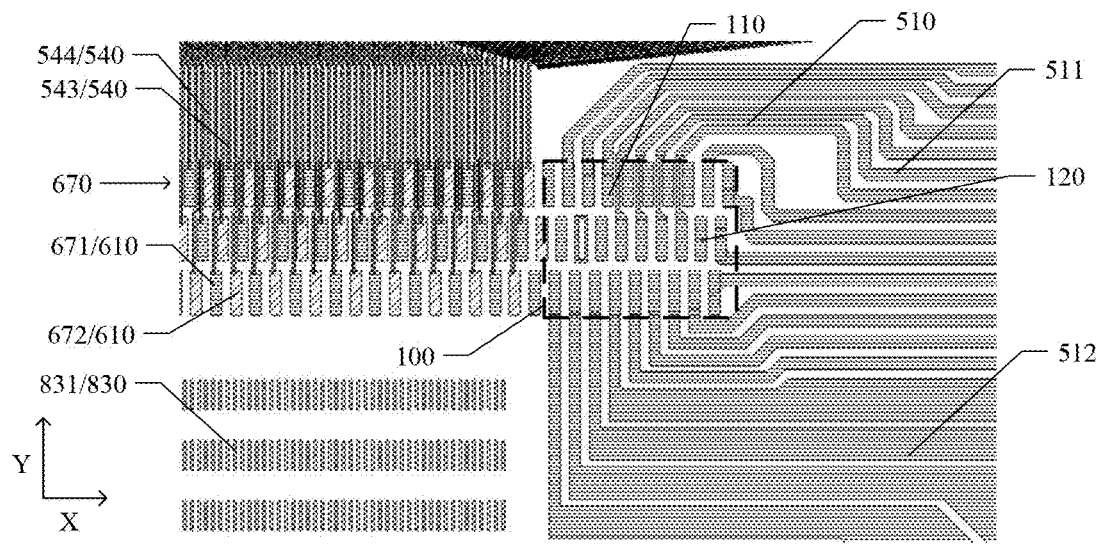
FIG. 6 is an enlarged view of a region B illustrated in FIG. 4.
Figure 7:
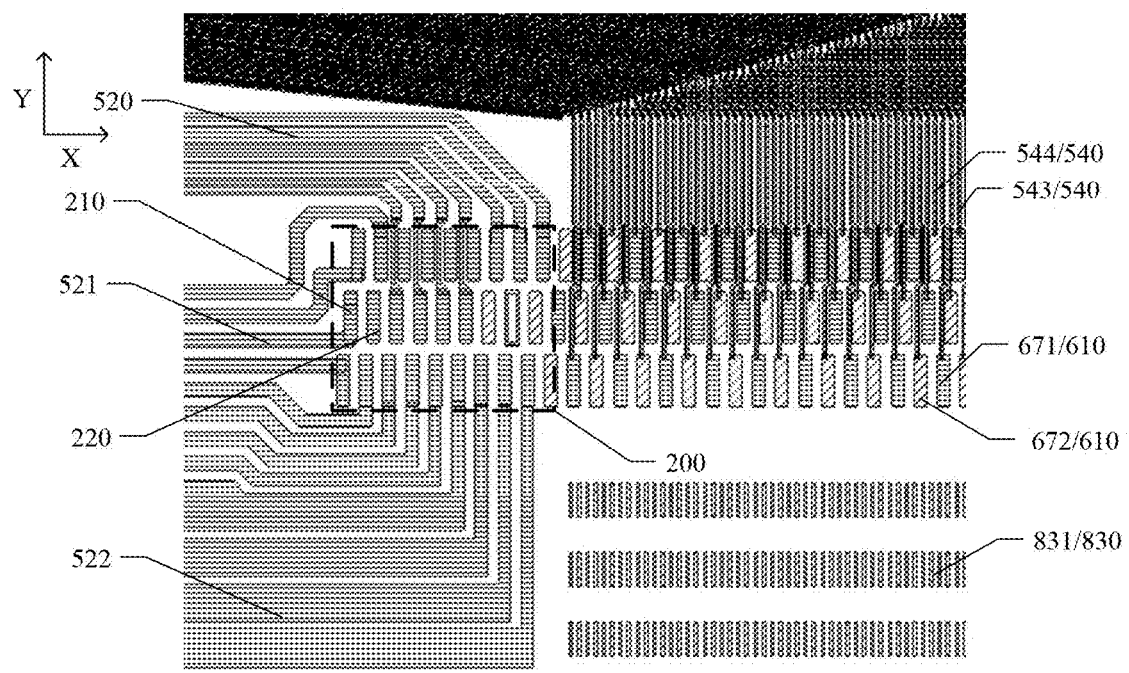
FIG. 7 is an enlarged view of a region C illustrated in FIG. 5.
Figure 8:
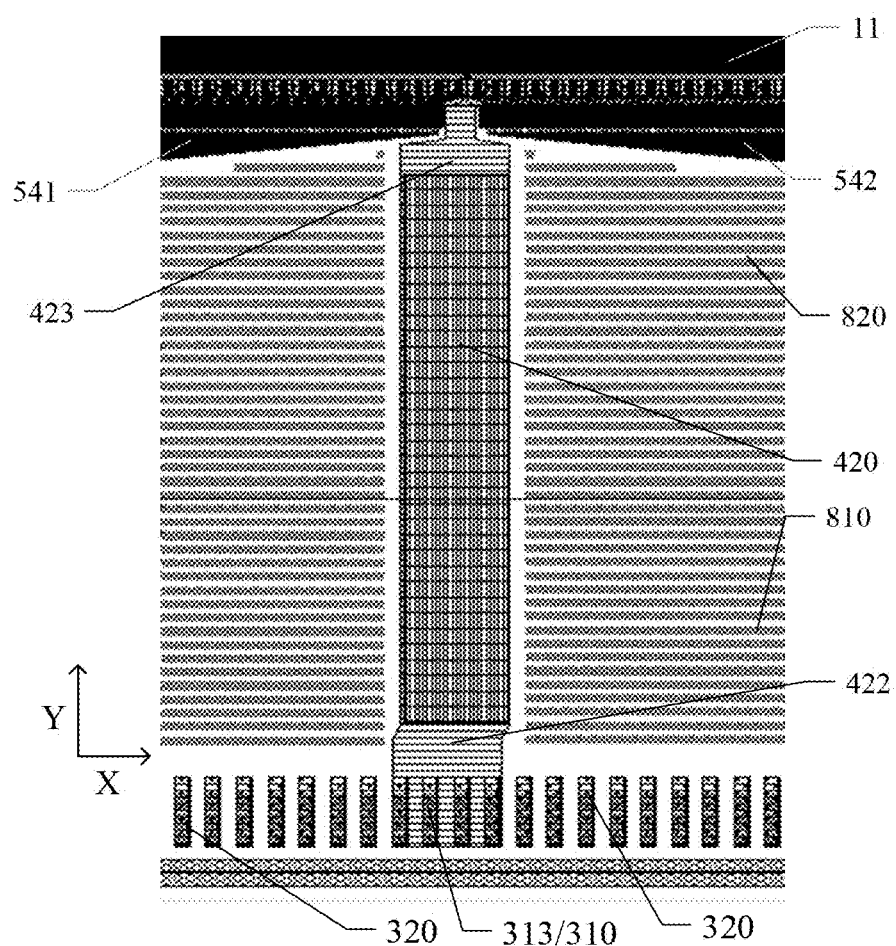
FIG. 8 is a schematic view of a common signal line and surrounding structures.
Figure 9:
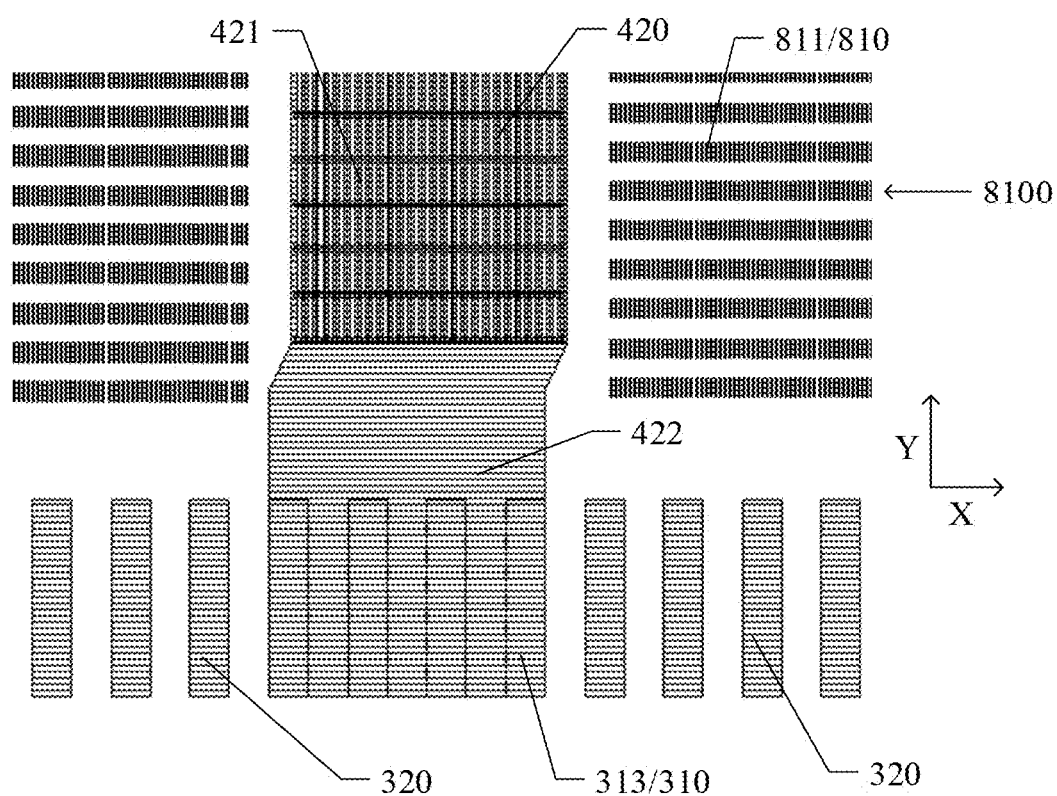
FIG. 9 and FIG. 10 are schematic enlarged views of two ends of the common signal line, respectively.
Figure 10:
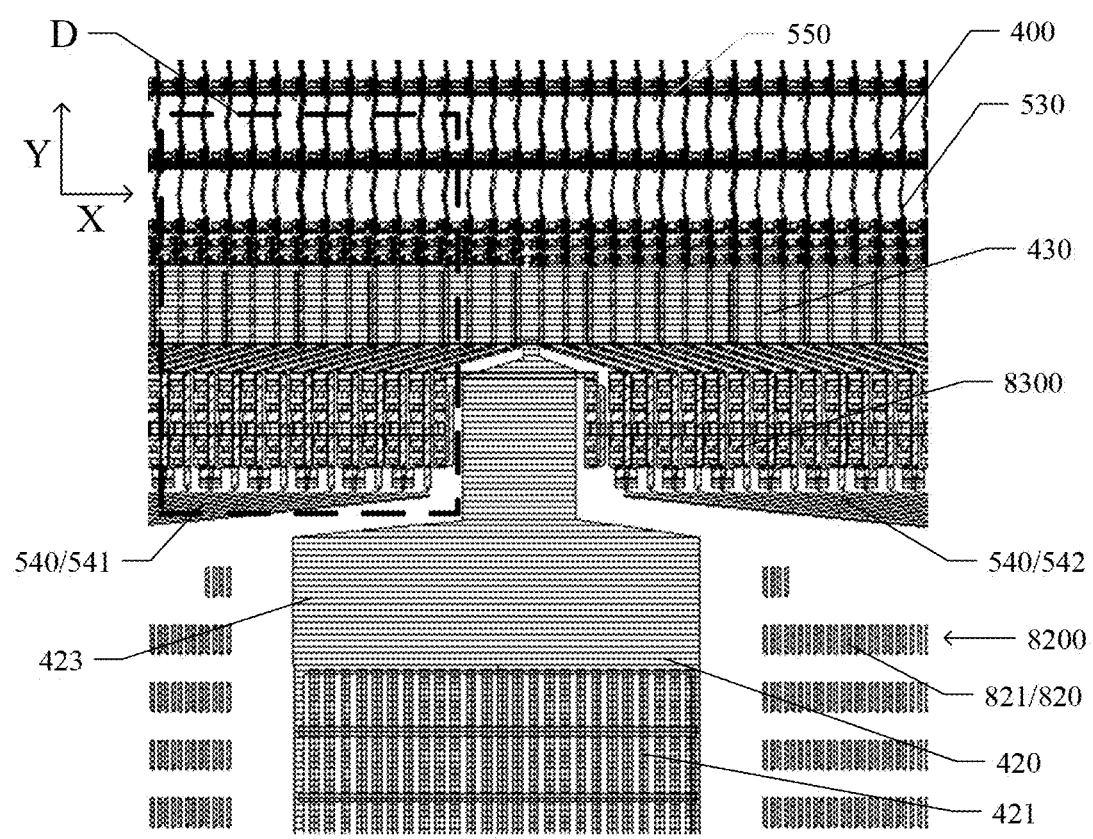

FIG. 2 is a schematic view of a partial planar structure of a display panel according to an embodiment of the present disclosure. FIG. 3 and FIG. 5 are respectively enlarged views of different regions in a peripheral region illustrated in FIG. 2. FIG. 4 is an enlarged view of a region A illustrated in FIG. 3. FIG. 6 is an enlarged view of a region B illustrated in FIG. 4. FIG. 7 is an enlarged view of a region C illustrated in FIG. 5. FIG. 8 is a schematic view of a common signal line and surrounding structures. FIG. 9 and FIG. 10 are schematic enlarged views of two ends of the common signal line, respectively.

As illustrated in FIG. 2, the display panel includes a base substrate 10, and the base substrate 10 includes a display region 11 and a peripheral region 12, that is, the display panel includes the display region 11 and the peripheral region 12. For example, the display region 11 is a region for displaying images, and the peripheral region 12 is a region not for displaying images. For example, the peripheral region 12 is located on at least one side of the display region 11; and for another example, the peripheral region 12 surrounds the display region 11.

As illustrated in FIG. 2, the display panel includes a first pad region 100, a second pad region 200, and a third pad region 300 located in the peripheral region 12, a plurality of sub-pixels 400 located in the display region 11, and a common signal line 420 located in the peripheral region 12.

As illustrated in FIG. 2, FIG. 6 and FIG. 7, the first pad region 100 includes at least one first pad 110, and the at least one first pad 110 is configured to be electrically connected to a first integrated circuit; and the second pad region 200 includes at least one second pad 210, and the at least one second pad 210 is configured to be electrically connected to a second integrated circuit.

For example, the first integrated circuit and the second integrated circuit are two different integrated circuits (IC) provided outside the display panel, some pins in the first integrated circuit are configured to be electrically connected to first pads 110, and some pins in the second integrated circuit are configured to be electrically connected to second pads 210.

For example, the first pad region 100 includes a plurality of first pads 110, and the second pad region 200 includes a plurality of second pads 210. For example, the first pads 110 in the first pad region 100 are all electrically connected to the first integrated circuit, and the second pads 210 in the second pad region 200 are all electrically connected to the second integrated circuit. The electrical connection between the first pads and the first integrated circuit, and the electrical connection between the second pads and the second integrated circuit are achieved by anisotropic conductive adhesive or welding, which is not limited here. For example, the first integrated circuit and the second integrated circuit may be interchanged.

As illustrated in FIG. 2-FIG. 5, the third pad region 300 includes a plurality of third pads 310, the plurality of third pads 310 are configured to be electrically connected to the circuit board, and the third pad region 300 is located on a side of the first pad region 100 and the second pad region 200 away from the display region 11.

For example, the circuit board is a structure provided outside the display panel, and some pins of the circuit board are electrically connected to input pins of the first integrated circuit through the third pads 310. For example, the circuit board is a flexible printed circuit board (FPC).

As illustrated in FIG. 2, the plurality of sub-pixels 400 include a common electrode 410. For example, the common electrode 410 is a common electrode shared by the plurality of sub-pixels 400; for example, the common electrode 410 can be an entire surface electrode, or can be independent electrodes corresponding to pixel electrodes, and a plurality of independent electrodes are electrically connected together through a connection line; or the common electrode has a strip-shape, each row of sub-pixels corresponds to one common electrode, and the common electrodes corresponding to adjacent rows are electrically connected together through a connection line, etc. The specific shape of the common electrode is not limited.

As illustrated in FIG. 2 and FIG. 3, the common signal line 420 is electrically connected to the common electrode 410, the common signal line 420 is located in the peripheral region 12 and extends along a first direction, the first pad region 100 and the second pad region 200 are located on both sides of the common signal line 420 in a second direction, and the first direction intersects with the second direction.

For example, the figures schematically illustrate that the first direction is the Y direction, the second direction is the X direction, but they are not limited thereto, and the first direction and the second direction can be interchanged. For example, the first direction is perpendicular to the second direction, but not limited thereto, and an included angle between the first direction and the second direction is 60-120 degrees, such as 70-110 degrees, such as 80-100 degrees, such as 85-95 degrees.

As illustrated in FIG. 2-FIG. 5, the display panel further includes at least one first signal line 510 and at least one second signal line 520, the at least one first pad 110 is electrically connected to a first portion 311 of the plurality of third pads 310 through the at least one first signal line 510, the at least one second pad 210 is electrically connected to a second portion of the plurality of third pads 310 through the at least one second signal line 520, and the common signal line 420 is electrically connected to an output terminal of the circuit board through a third portion 313 of the plurality of third pads 310. For example, the first portion 311 and the second portion 312 of the third pads 310 are respectively located on both sides of the third portion 313 of the third pads 310. For example, the total number of pads included in at least one of the first portion 311, the second portion 312 and the third portion 313 of the third pads 310 is greater than 1. For example, the total number of pads included in the first portion 311 of the third pads 310 is equal to the total number of pads included in the second portion 312 of the third pads 310, and the total number of pads included in the first portion 311 of the third pads 310 and the total number of pads included in the second portion 312 of the third pads 310 are both greater than the total number of pads included in the third portion 313 of the third pads 310.

As illustrated in FIG. 2, the at least one first signal line 510 and the at least one second signal line 520 are configured to be electrically connected to each other through the third pads 310 and the circuit board. For example, the third pads 310 are configured to be electrically connected to pins of the circuit board, thereby achieving that the first signal line is electrically connected to the second signal line through the third pads and the circuit board. For example, the first signal line 510 and the second signal line 520 are not directly connected to each other on the display panel.

In the display panel provided by the present disclosure, the first signal line and the second signal line are electrically connected to each other through the third pads and the circuit board, thereby avoiding the electrostatic breakdown between the first signal line and the common signal line, and between the second signal line and the common signal line.

For example, the total number of the first signal lines 510 is the same as the total number of the second signal lines 520, and the plurality of first signal lines 510 and the plurality of second signal lines 520 achieve one-to-one electrical connection through the third pads 310 and the circuit board. For example, the total number of first signal lines 510 is greater than ten, and the total number of second signal lines 520 is greater than ten.

In some examples, as illustrated in FIG. 2-FIG. 9, in a direction perpendicular to the base substrate 10, such as a direction perpendicular to the XY plane, both the at least one first signal line 510 and the at least one second signal line 520 do not overlap with the common signal line 420. For example, each first signal line 510 does not overlap with the common signal line 420, and each second signal line 520 does not overlap with the common signal line 420.

In some examples, as illustrated in FIG. 2, the signal configured to be transmitted on the first signal line 510 and the signal configured to be transmitted on a second signal line 520 corresponding to the first signal line 510 are the same signal, and the same signal includes at least one of a synchronization signal and a gamma signal. The above-mentioned "a second signal line 520 corresponding to the first signal line 510" refers to a second signal line 520 electrically connected to the first signal line 510 through the third pads 310 and the circuit board.

For example, the first signal line 510 and the second signal line 520 may also be referred to as synchronization signal lines. For example, the synchronization signal transmitted by the first signal line 510 and the second signal line 520 is a SYNC (synchronized signals between master and slave) signal, the synchronization and consistency of two integrated circuits (IC) used to drive the display panel to display are achieved through the electrical connection between the first signal line 510 and the second signal line 520, for example, enabling control signals, such as a data signal, output from timing controllers (TCON) integrated in the two ICs respectively, consistent, and thus achieving normal display of two partial regions of the display panel corresponding to the two ICs.

For example, the gamma signal transmitted by the first signal line 510 and the second signal line 520 can be GMHN, GMLN, GMHP (Gamma voltage link when use cascade function) or GMLP, where H represents high voltage, L represents low voltage, P represents positive voltage, and N represents negative voltage. Gamma voltage is used to compensate the non-linear perception of light by the human eye through the light and dark changes on the display panel, thereby forming a linear transformation in the brain; the conversion of the corresponding driving voltage according to the transmittance versus voltage (VT) curve of the display panel, which is usually the basis for the internal analog-to-digital conversion of the source driver; and the use of Gamma voltage is to first select a black point voltage or a white point voltage (configured to determine a liquid crystal deflection range) and the common electrode voltage (Vcom), and then adjust the voltage of middle gray scales. The Gamma signal is transmitted in the first signal line and the second signal line connected between the two ICs to achieve the consistency of the Gamma signal compensation in the two ICs, and then achieve the normal display of two partial regions of the display panel corresponding to the two ICs.

For example, the IC supports a single mode and a cascade mode to correspond to different resolutions of the display panel, and the above-mentioned two ICs are regarded as including a master IC and a slave IC. The two ICs are cascaded to each other by connecting synchronization signal lines between the master IC and the slave IC, so that the two ICs become equivalent to an extended IC, and the extended IC is configured to transmit signals to the above-mentioned two partial regions.

In a general display panel, a common signal line electrically connected to a circuit board overlaps with synchronization signal lines connecting two ICs in a direction perpendicular to the base substrate. Compared with such a display panel, in the display panel provided by the present disclosure, the first signal line and the second signal line are electrically connected to each other through the third pads and the circuit board, so that the common signal line, the first signal line and the second signal line do not overlap with each other in the direction perpendicular to the base substrate, thereby avoiding the common signal line from crossing the synchronization signal lines connecting different ICs without increasing the cost, thereby avoiding the problem of short circuit caused by static electricity in the process and improving the product quality and product yield.

In some examples, as illustrated in FIG. 2 and FIG. 3, at least one kind of the at least one first signal line 510 and the at least one second signal line 520 is provided in the same layer as the common signal line and is insulated from the common signal line. For example, the first signal line 510 and the second signal line 520 are provided in the same layer, and the first signal line 510, the second signal line 520 and the common signal line 420 are all provided in the same layer.

For example, as illustrated in FIG. 2 and FIG. 10, gate lines 550 electrically connected to the sub-pixels 400 are also provided in the display region 11, and the first signal line 510, the second signal line 520, and the common signal line 420 are structures provided in the same layer as the gate lines 550.

For example, as illustrated in FIG. 2-FIG. 7, the first pad 110 and the first signal line 510 are structures provided in the same layer, and the second pad 210 and the second signal line 520 are structures provided in the same layer. For example, the first pad 110 and the first signal line 510 can be an integral structure, and the second pad 210 and the second signal line 520 can be an integral structure. For example, the third pad 310 and the first pad 110 are structures provided in different layers.

In some examples, as illustrated in FIG. 4 and FIG. 5, at least one signal line of the at least one first signal line 510 and the at least one second signal line 520 includes a signal line portion 501 extending along the second direction and a signal line portion 502 extending along a third direction, the line width of the signal line portion 501 extending along the second direction is smaller than the line width of the signal line portion 502 extending along the third direction, and both the first direction and the second direction intersect with the third direction. For example, the line width of the signal line portion 501 of the first signal line 510 is smaller than the line width of the signal line portion 502 of the first signal line 510. For example, the line width of the signal line portion 501 of the second signal line 520 is smaller than the line width of the signal line portion 502 of the second signal line 520.

Compared with the case where a general synchronization signal line only extends along the second direction and have a small line width, in the display panel provided by the present disclosure, each first signal line and each second signal line includes not only a portion extending along the second direction but also a portion extending along the third direction, and by setting the line width of the portion extending along the third direction to be greater than the line width of the portion extending along the second direction, it is beneficial to reduce the resistance of each first signal line and the resistance of each second signal line to improve electrical characteristics of the first signal line and the second signal line.

For example, as illustrated in FIG. 4-FIG. 7, the plurality of first signal lines 510 includes signal lines with different line widths of signal line portions 501, such as signal lines 511 and signal lines 512; the plurality of second signal lines 520 include signal lines with different line widths of signal line portions 501, such as signal lines 521 and signal lines 522; and the signal line 511 is electrically connected to the signal line 521, the signal line 512 is electrically connected to the signal line 522, the signal line 511 and the signal line 521 are configured to transmit a SYNC signal, and the signal line 512 and the signal line 522 are configured to transmit a Gamma signal. For example, the total number of the signal lines 511 is 15, the total number of the signal lines 512 is 4, and along the direction indicated by the arrow in the Y direction, the signals transmitted by 4 signal lines 512 are GMLN, GMHN, GMHP and GMLP in sequence. For example, the signal lines 512 are located on a side of the signal lines 511 away from the display region.

For example, as illustrated in FIG. 6, the total number of the first pads 110 is a plurality, and the plurality of first pads 110 is arranged in three rows to save space of the first pad region 100 in the second direction. For example, the signal lines 511 of the plurality of first signal lines 510 are electrically connected to three rows of first pads 110, and the signal lines 512 are only electrically connected to one row of first pads 110 of the three rows of first pads 110 farthest from the display region.

For example, as illustrated in FIG. 6, two adjacent rows of first pads 110 are shifted from each other to facilitate electrical connection between the first pads 110 in the middle row and the first signal lines 510, for example, a first signal line 510 electrically connected to a first pad 110 located in the second row passes through a spacing between adjacent first pads 110 located in the first row.

The above-mentioned "two adjacent rows of first pads 110 are shifted from each other" means that at least part of at least one first pad in the second row is opposite to the spacing between adjacent first pads in the first row. For example, the distance staggered by two adjacent rows of first pads in the X direction is not greater than one first pad pitch.

For example, as illustrated in FIG. 6 and FIG. 7, the distribution of the second pads 210 and the connection relationship between the second pads 210 and the second signal lines 520 can be the same as the distribution of the first pads 110 and the connection relationship between the first pads 110 and the first signal line 510, and will not be repeated here.

For example, as illustrated in FIG. 4, the ratio of line widths of the signal line portions 502 of different first signal lines 510 is 0.8-1.2, or 0.9-1.1, or 1. For example, the different first signal lines 510 further include signal line portions 503 extending along the first direction, and the ratio of line widths of the signal line portions 503 of the different first signal lines 510 is 0.8-1.2, or 0.9-1.1, or 1. In the display panel provided by the present disclosure, the difference of the line widths between the signal line portions, extending along the third direction, of the different first signal lines is set to be small, and the difference of the line widths between the signal line portions, extending along the first direction, of the different first signal lines is set to be small, which facilitates the corresponding electrical connection between different first signal lines and corresponding third pads.

For example, as illustrated in FIG. 5, the ratio of line widths of the signal line portions 502 of different second signal lines 520 is 0.8-1.2, or 0.9-1.1, or 1. For example, the different second signal lines 520 further include signal line portions 503 extending along the first direction, and the ratio of line widths of the signal line portions 503 of the different second signal lines 520 is 0.8-1.2, or 0.9-1.1, or 1. In the display panel provided by the present disclosure, the difference of the line widths between the signal line portions, extending along the third direction, of the different second signal lines is set to be small, and the difference of the line widths between the signal line portions, extending along the first direction, of the different second signal lines is set to be small, which facilitates the corresponding electrical connection between different second signal lines and corresponding third pads.

In some examples, as illustrated in FIG. 2 and FIG. 8, the common signal line 420 is electrically connected to at least one third pad 310. As illustrated in FIG. 4 and FIG. 5, each first signal line 510 is electrically connected to one third pad 310, and each second signal line 520 is electrically connected to one third pad 310.

For example, the first pad 110, the second pad 210 and the third pad 310 all extend along the first direction, the length of the first pad 110 is the same as the length of the second pad 210, and the length of the third pad 310 is greater than the length of the first pad 110.

For example, as illustrated in FIG. 4 and FIG. 5, the total number of the first portions 311 of the third pads 310 is the same as the total number of the first signal lines 510, and the first portions 311 of the third pads 310 are electrically connected to the first signal lines 510 in a one-to-one correspondence. For example, the total number of the second portions 312 of the third pads 310 is the same as the total number of the second signal lines 520, and the second portions 312 of the third pads 310 are electrically connected to the second signal lines 520 in a one-to-one correspondence. Of course, the embodiments of the present disclosure are not limited thereto, one first signal line may be connected to a plurality of third pads correspondingly, and one second signal line may be connected to a plurality of third pads correspondingly.

For example, the total number of the first portions 311 of the third pads 310 is the same as the total number of the second portions 312 of the third pads 310. For example, the total number of the third portions 313 of the third pads 310 is less than the total number of the first portions 311 of the third pads 310.

In some examples, as illustrated in FIG. 2, FIG. 3 and FIG. 9, a plurality of first dummy pads 320 is provided between the third pad 310 electrically connected to the common signal line 420 and the third pad 310 electrically connected to the first signal line 510, and provided between the third pad 310 electrically connected to the common signal line 420 and the third pad 310 electrically connected to the second signal line 520. The first dummy pad 320 is a pad that is not electrically connected to any structure on the display panel.

For example, as illustrated in FIG. 2 and FIG. 3, the first dummy pads 320 are provided in the same layer as the third pads 310. For example, the total number of the first dummy pads 320 is greater than the total number of the first portions 311 of the third pads 310. For example, the total number of the first dummy pads 320 is greater than the total number of the third portions 313 of the third pads 310. The etching uniformity of the third pads is improved by providing the first dummy pad between the first portion of the third pad and the third portion of the third pad, and between the second portion of the third pad and the third portion of the third pad.

In some examples, as illustrated in FIG. 6 and FIG. 7, the first pad region 100 further includes at least one second dummy pad 120, and the second pad region 200 further includes at least one third dummy pad 220. For example, the first pad region 100 includes a first pad 110 electrically connected to the first signal line 510 and a second dummy pad 120 not electrically connected to the first signal line 510; and the second pad region 200 includes a second pad 210 electrically connected to the second signal line 520 and a third dummy pad 220 not electrically connected to the second signal line 520. The second dummy pad 120 is a pad that is not electrically connected to any structure on the display panel. For example, the total number of the second dummy pads 120 is a plurality, and the second dummy pad includes a portion between the first row of first pads 110 and a portion between the second row of first pads 110. By providing the second dummy pads, it is possible to avoid the interference of adjacent first signal lines and improve the etching uniformity of the first pad region; similarly, the third dummy pad is a pad that is not electrically connected to any structure on the display panel, and providing a plurality of third dummy pads in the second pad region can avoid interference of adjacent second signal lines and improve the etching uniformity of the second pad region.

For example, the second dummy pad 120 is provided in the same layer as the first pad 110, or in a different layer from the first pad 110; and the third dummy pad 220 is provided in the same layer as the second pad 210, or in a different layer from the second pad 210.

In some examples, as illustrated in FIG. 2, FIG. 4 to FIG. 7, the at least one first signal line 510 and the at least one second signal line 520 are distributed symmetrically relative to a straight line located between the first pad region 100 and the second pad region 200 and extending along the first direction. For example, the first signal line 510 and the second signal line 520 electrically connected to each other are distributed symmetrically relative to a straight line located between the first pad region 100 and the second pad region 200 and extending along the first direction. For example, the first portion 311 of the third pad 310 and the second portion 312 of the third pad 310 are distributed symmetrically relative to the third portion 313 of the third pad 310.

In some examples, as illustrated in FIG. 2-FIG. 5 and FIG. 8-FIG. 9, a first dummy structure group 810 is provided between the common signal line 420 and at least one kind of the at least one first signal line 510 and the at least one second signal line 520; and a straight line extending along the second direction passes through orthographic projections of at least one kind of the at least one first signal line 510 and the at least one second signal line 520, the first dummy structure group 810, and the common signal line 420 on the base substrate 10. The first dummy structure group 810 is not electrically connected to any structure on the display panel. Providing the first dummy structure group can improve the distribution uniformity of the film layer on the display panel, and ensure the uniformity of pattern etching of the first signal line and the second signal line during the manufacturing process.

For example, the first dummy structure group 810 is provided between the first signal line 510 and the common signal line 420 and between the second signal line 520 and the common signal line 420, and the straight line extending along the second direction passes through orthographic projections of the first dummy structure group 810, the common signal line 420, the first signal line 510 and the second signal line 520 on the base substrate 10.

In some examples, as illustrated in FIG. 2-FIG. 5 and FIG. 8-FIG. 9, in the direction perpendicular to the base substrate 10, the first signal line 510, the second signal line 520 and the common signal line 420 do not overlap with the first dummy structure group 810.

In some examples, as illustrated in FIG. 2-FIG. 5 and FIG. 8-FIG. 9, the first dummy structure group 810 includes a plurality of first dummy structure rows 8100 arranged along the first direction, and each first dummy structure row 8100 includes a plurality of first dummy structures 811 arranged along the second direction. For example, adjacent first dummy structure rows 8100 are aligned. Of course, the embodiments of the present disclosure are not limited thereto, and the first dummy structure group may also include a plurality of dummy structure lines arranged along the first direction.

For example, as illustrated in FIG. 4, and FIG. 8-FIG. 9, each first dummy structure 811 is a strip-shaped structure extending along the first direction. For example, the length of the strip-shaped structure is relatively short, and for example, the length of the strip-shaped structure along the first direction is smaller than the line width of the signal line portion 503, extending along the third direction, of the first signal line 510; and for another example, the length of the strip-shaped structure along the first direction is smaller than the length of the first pad 110, and the length of the strip-shaped structure along the first direction is smaller than the length of the third pad 310.

For example, the plurality of first dummy structures 811 include some first dummy structures 811 in the same layer as the common signal line 420 and some first dummy structures 811 in a different layer from the common signal line 420. For example, the first dummy structures 811 in the same layer as the common signal line 420 and the first dummy structures 811 in a different layer from the common signal line 420 are alternately arranged in the second direction.

The first dummy structure group provided in the present disclosure includes a plurality of first dummy structures, each of which is provided as a strip-shaped structure with a short length to avoid electrostatic discharge (ESD) caused by charge accumulation on the first dummy structures.

In some examples, as illustrated in FIG. 2-FIG. 3, the maximum length of a portion of at least one kind of the at least one first signal line 510 and the at least one second signal line 520 extending along the second direction is smaller than the maximum dimension of the first dummy structure group 810 in the second direction. For example, the maximum length of the portions of respective first signal lines 510 extending along the second direction and the maximum length of the portions of respective second signal lines 520 extending along the second direction are both smaller than the maximum dimension of one row of first dummy structure rows 8100 in the second direction.

In some examples, as illustrated in FIG. 2-FIG. 3, FIG. 8 and FIG. 10, a second dummy structure group 820 is provided between the first dummy structure group 810 and the display region 11; and a straight line extending along the second direction passes through orthographic projections of the second dummy structure group 820 and the common signal line 420 on the base substrate 10, and the straight line does not pass through orthographic projections of the first signal line 510 and the second signal line 520 on the base substrate 10.

For example, with a straight line where a signal line portion 501, extending along the second direction, of the first signal lines 510 on the side closest to the display region 10 is located as a boundary, the dummy structures provided between the common signal line 420 and the first signal line 510 are divided into the first dummy structure group 810 and the second dummy structure group 820. The orthographic projection of the first dummy structure 811 of the first dummy structure group 810 on a plane perpendicular to the X direction overlaps with the orthographic projection of the first signal line 510 on the plane perpendicular to the X direction, and the orthographic projection of the second dummy structure 821 of the second dummy structure group 820 on the plane perpendicular to the X direction does not overlap with the orthographic projection of the first signal line 510 on the plane perpendicular to the X direction.

In some examples, as illustrated in FIG. 2-FIG. 3, FIG. 8 and FIG. 10, the second dummy structure group 820 includes a plurality of second dummy structure rows 8200 arranged along the first direction, and each second dummy structure row 8200 includes a plurality of second dummy structures 821 arranged along the second direction. For example, adjacent second dummy structure rows 8200 are aligned. Of course, the embodiments of the present disclosure are not limited thereto, and the first dummy structure group may also include a plurality of dummy structure lines arranged along the first direction.

For example, as illustrated in FIG. 4, FIG. 8 and FIG. 10, each second dummy structure 821 is a strip-shaped structure extending along the first direction. For example, the length of the strip-shaped structure is relatively short, for example, the length of the strip-shaped structure along the first direction is smaller than the length of the first pad 110, and the length of the strip-shaped structure along the first direction is smaller than the length of the third pad 310.

For example, the plurality of second dummy structures 821 include some second dummy structures 821 in the same layer as the common signal line 420 and some second dummy structures 821 in a different layer from the common signal line 420. For example, the second dummy structures 821 in the same layer as the common signal line 420 and the second dummy structures 821 in a different layer from the common signal line 420 are alternately arranged in the second direction, for example, in the same layer as the source-drain metal layer.

The second dummy structure group provided in the present disclosure includes a plurality of second dummy structures, each of which is provided as a strip-shaped structure with a short length to avoid electrostatic discharge (ESD) caused by charge accumulation on the second dummy structures.

In some examples, as illustrated in FIG. 8-FIG. 10, the common signal line 420 includes a hollow portion 421. For example, the hollow portion 421 includes a plurality of openings.

The display panel provided by the present disclosure may be a liquid crystal display panel, and the liquid crystal display panel includes a liquid crystal layer and a seal adhesive surrounding the liquid crystal layer. By providing a hollow portion in the seal adhesive covered by the common signal line, on the one hand, the light transmittance at the position of the common signal line can be increased to ensure the curing of the seal adhesive covered by the common signal line; on the other hand, electrostatic discharge (ESD) can be avoided in the process of manufacturing the display panel in the case where the common signal line is provided as a large piece of metal.

For example, as illustrated in FIG. 8-FIG. 10, the common signal line 420 further includes a first block structure 422 located on a side of the hollow portion 421 close to the third pad 310, and the first block structure 422 is electrically connected to the third pad 310.

For example, as illustrated in FIG. 8-FIG. 10, the first block structure 422 is provided as a bent structure to achieve that edges of both sides of the first block structure 422 extending along the first direction can be aligned with edges on both sides of the third pad 310 electrically connected to the first block structure 422, thereby achieving a better electrical connection between the common signal line and the third pad, and also preventing the common signal line from interfering with the first dummy pad.

For example, as illustrated in FIG. 2 and FIG. 10, the display panel further includes a circle of common electrode line 430 surrounding the display region 11, and the common electrode line 430 is electrically connected to the third pad 310. For example, the common electrode line 430 is electrically connected to a common electrode 410, and the common signal line 420 is electrically connected to the common electrode 410 through the common electrode line 430.

For example, as illustrated in FIG. 2, the display panel further includes a circle of common compensation line (Vcom compensation) 440 surrounding the common electrode lines 430, and a common feedback line (Vcom feedback) 450 located between the common compensation line 440 and the common electrode line 430, and the common compensation line 440 is electrically connected to the common electrode line 430. For example, both the common compensation line 440 and the common feedback line 450 are both electrically connected to the third pad 310. For example, the common compensation line 440 is directly connected to the common electrode line 430 to improve the stability of the common voltage. For example, the common feedback line 450 is directly connected to the middle of the common electrode line 430 to compensate the common voltage of the upper half of the display panel.

For example, as illustrated in FIG. 2, FIG. 8 and FIG. 10, the common signal line 420 further includes a second block portion 423 located on a side of the hollow portion 421 close to the display region 11, and the second block portion 423 is electrically connected to the common electrode line 430. For example, the width (dimension along the second direction) of the second block portion 423 is smaller as it gets closer to the display region 11 to prevent the common signal line from interfering with the fanout regions on both sides (described later).

Figure 11:
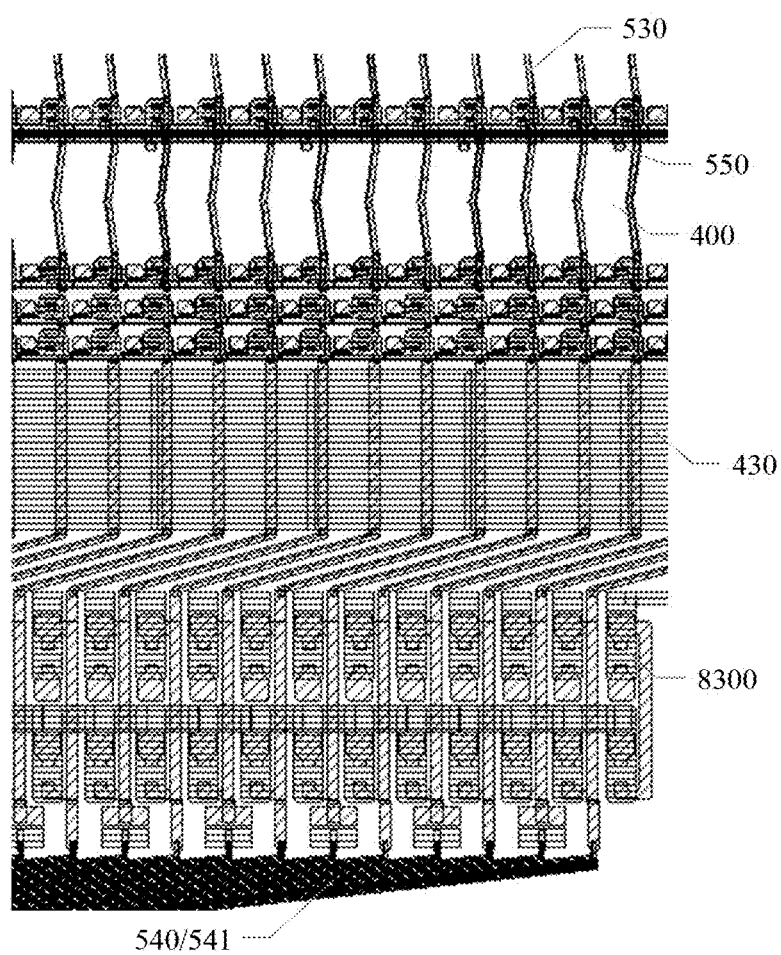
FIG. 11 is an enlarged view of a region D illustrated in FIG. 10.
Figure 12:
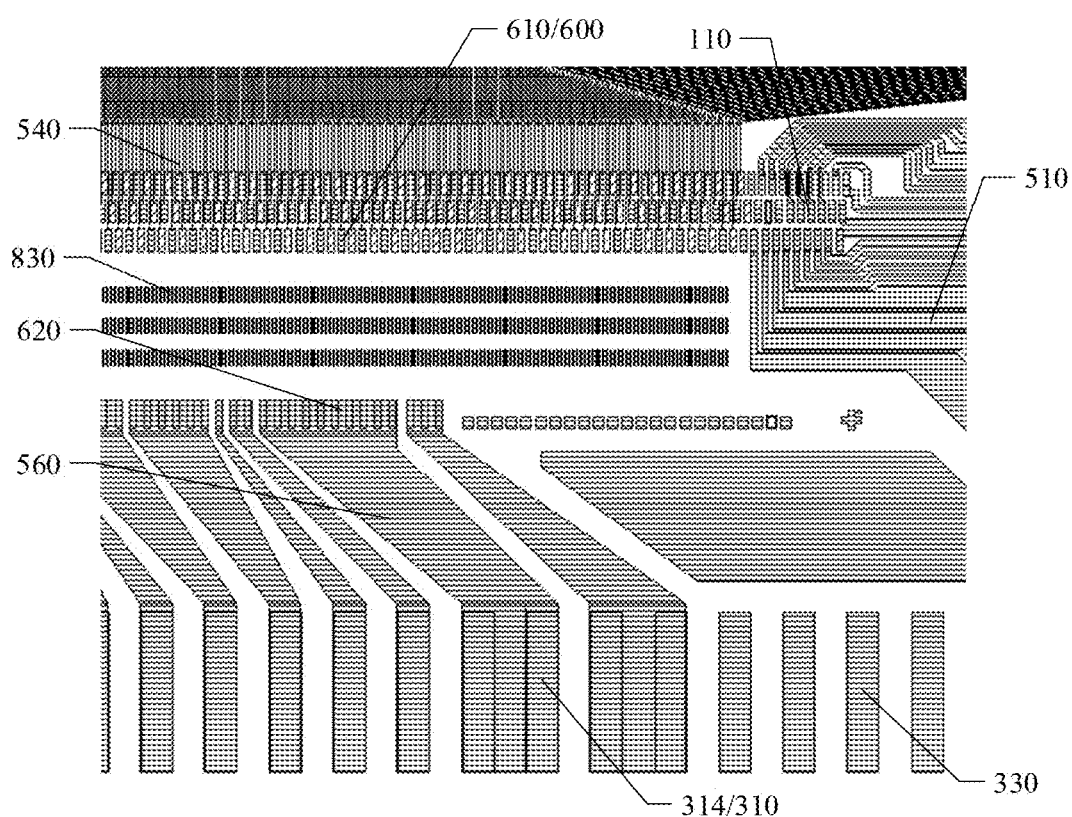
FIG. 12 is an enlarged view of a partial region illustrated in FIG. 4.
Figure 13:
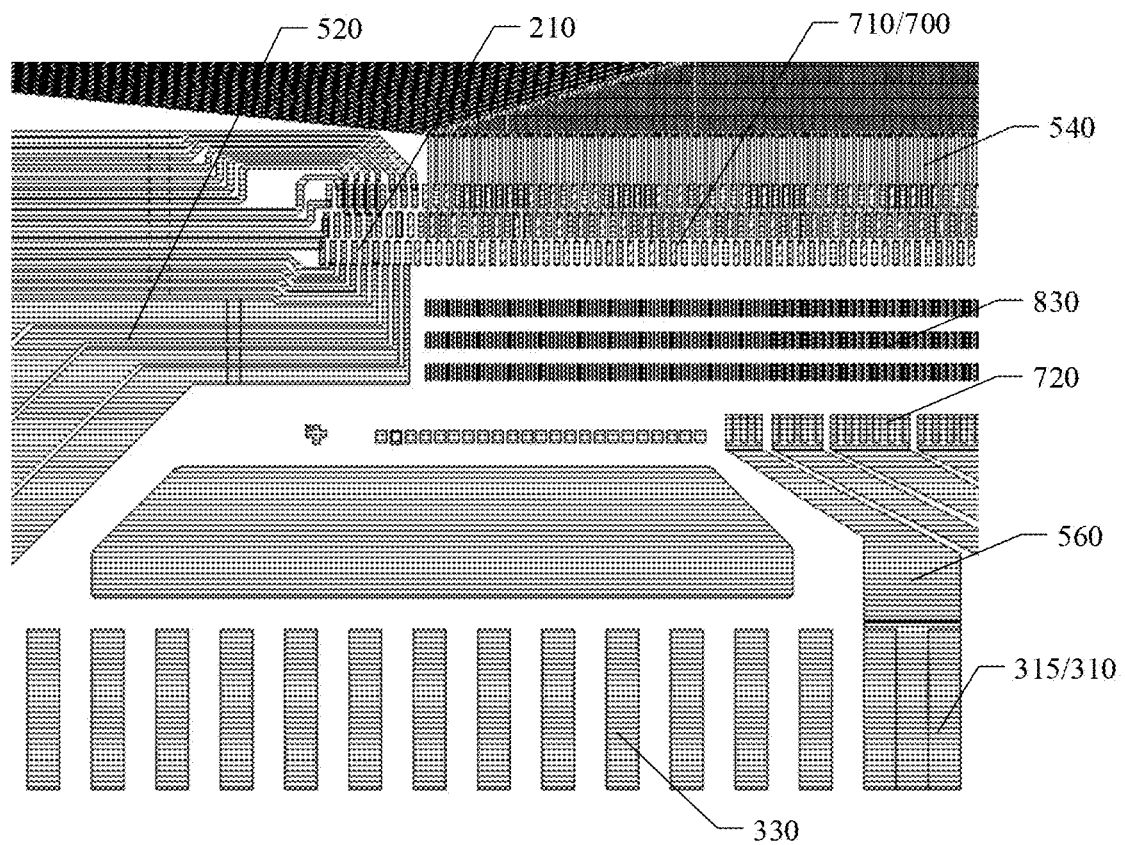
FIG. 13 is an enlarged view of a partial region illustrated in FIG. 5.

FIG. 11 is an enlarged view of a region D illustrated in FIG. 10, FIG. 12 is an enlarged view of a partial region illustrated in FIG. 4, and FIG. 13 is an enlarged view of a partial region illustrated in FIG. 5.

In some examples, as illustrated in FIG. 2, FIG. 10 and FIG. 11, the display panel further includes a plurality of signal transmission lines 530 electrically connected to at least part of the plurality of sub-pixels 400. For example, the signal transmission lines 530 include a data line.

In some examples, as illustrated in FIG. 2, FIG. 4-FIG. 7 and FIG. 12-FIG. 13, the display panel further includes a fourth pad region 600 and a fifth pad region 700, the fourth pad region 600 is located on a side of the first pad region 100 away from the common signal line 420, and the fifth pad region 700 is located on a side of the second pad region 200 away from the common signal line 420. The fourth pad region 600 includes a plurality of fourth pads 610, and the plurality of fourth pads 610 are configured to electrically connect an output terminal of the first integrated circuit to at least part of the plurality of signal transmission lines 530. The fifth pad region 700 includes a plurality of fifth pads 710, and the plurality of fifth pads 710 are configured to electrically connect an output terminal of the second integrated circuit to at least part of the plurality of signal transmission lines 530. A fourth portion 314 of the plurality of third pads 310 is configured to electrically connect an input terminal of the first integrated circuit to the output terminal of the circuit board, and a fifth portion 315 of the plurality of third pads 310 is configured to electrically connect an input terminal of the second integrated circuit to the output terminal of the circuit board.

For example, as illustrated in FIG. 2, FIG. 4-FIG. 7 and FIG. 12-FIG. 13, the first pad 110 and the fourth pad 610 are electrically connected to the same integrated circuit, and the second pad 210 and the fifth pad 710 are electrically connected to the same integrated circuit. For example, the shape and dimension of the fourth pad 610 are the same as the shape and dimension of the first pad 110. For example, the shape and dimension of the fifth pad 710 is the same as the shape and dimension of the second pad 210. For example, at least part of the fourth pads 610 are provided in the same layer as at least part of the first pads 110, and at least part of the fifth pads 710 are provided in the same layer as at least part of the second pads 210.

For example, the output terminal of the first integrated circuit is electrically connected to the fourth pad 610 to transmit a data signal to the signal transmission line 530 in one region, and the output terminal of the second integrated circuit is electrically connected to the fifth pad 710 to transmit a data signal to the signal transmission line 530 in another region.

For example, as illustrated in FIG. 12 and FIG. 13, a sixth pad 620 is further provided between the fourth pad 610 and the third pad 310, and the input terminal of the first integrated circuit is electrically connected to the output terminal of the circuit board through the sixth pad 620, a wire 560 connecting the sixth pad 620 and the fourth portion 314 of the third pads 310, and the fourth portion 314 of the third pads 310. For example, a seventh pad 720 is further provided between the fifth pad 710 and the third pad 310, and the input terminal of the second integrated circuit is electrically connected to the output terminal of the circuit board through the seventh pad 720, a wire 560 connecting the seventh pad 720 and the fifth portion 315 of the third pads 310, and the fifth portion 315 of the third pads 310.

For example, as illustrated in FIG. 12, one end of each wire 560 is connected to at least one sixth pad 620, and the other end of each wire 560 is connected to at least one third pad 310. For example, one end of a first wire 560 closest to the first pad 110 is connected to three sixth pads 620, and the other end of the first wire 560 is connected to two third pads 310; one end of a second wire 560 is connected to ten sixth pads 620, and the other end of the second wire 560 is connected to two third pads 310; one end of a third wire 560 is connected to two sixth pads 620, and the other end of the third wire 560 is connected to one third pad 310; and one end of a fourth wire 560 is connected to one sixth pad 620, and the other end of the fourth wire 560 is connected to one third pad 310. The total number of connections between the wires and the sixth pads and the third pads is determined according to product requirements. Similarly, as illustrated in FIG. 13, one end of each wire 560 is connected to at least one seventh pad 720, and the other end of each wire 560 is connected to at least one third pad 310.

For example, as illustrated in FIG. 6-FIG. 7 and FIG. 12-FIG. 13, a third dummy structure group 830 is further provided between the fourth pad 610 and the sixth pad 620 and between the fifth pad 710 and the seventh pad 720. For example, a straight line extending along the second direction passes through orthographic projections of the third dummy structure group 830, the first signal line 510 and the second signal line 520 on the base substrate. The third dummy structure group is not electrically connected to any structure on the display panel, and the third dummy structure group is provided to improve the distribution uniformity of the film layer on the display panel, and ensure the uniformity of pattern etching of the first pad, the second pad, the fifth pad and the sixth pad during the manufacturing process.

For example, as illustrated in FIG. 6-FIG. 7 and FIG. 12-FIG. 13, the third dummy structure group 830 includes a plurality of third dummy structure rows arranged along the first direction, and each third dummy structure row includes a plurality of third dummy structures 831 along the second direction. For example, adjacent third dummy structure rows are aligned.

For example, as illustrated in FIG. 6-FIG. 7 and FIG. 12-FIG. 13, each third dummy structure 831 is a strip-shaped structure extending along the first direction. For example, the length of the strip-shaped structure is relatively short, for example, the length of the strip-shaped structure along the first direction is smaller than the length of any one of the first pad 110, the second pad 210, the third pad 310, the fourth pad 610 and the fifth pad 710.

The third dummy structure group provided in the present disclosure includes a plurality of third dummy structures, each of which is provided as a strip-shaped structure with a short length to avoid electrostatic discharge (ESD) caused by charge accumulation on the third dummy structures.

For example, as illustrated in FIG. 4 and FIG. 5, dummy pads 330 are further provided between the fourth portion 314 of the third pads 310 and the first portion 311 of the third pads 310, and between the fifth portion 315 of the third pads 310 and the second portion 312 of the third pads 310. For example, the dummy pad 330 is not electrically connected to any structure of the display panel.

In some examples, as illustrated in FIG. 2-FIG. 8 and FIG. 10-FIG. 13, the display panel further includes a plurality of connection lines 540 located in the peripheral region 12 and configured to electrically connect at least part of the signal transmission lines 530 to the plurality of fourth pads 610, and electrically connect at least part of the signal transmission lines 530 to the plurality of fifth pads 710. For example, some of the signal transmission lines 530 are electrically connected to the output terminals of the first integrated circuit through the connection lines 540 and the fourth pads 610, and some other of the signal transmission lines 530 are electrically connected to the output terminals of the second integrated circuit through the connection lines 540 and the fifth pads 710.

In some examples, as illustrated in FIG. 2-FIG. 8 and FIG. 10-FIG. 13, a part of the plurality of connection lines 540 connected to the plurality of fourth pads 610 forms a first fanout region 541, a part of the plurality of connection lines 540 connected to the plurality of fifth pads 710 forms a second fanout region 542, and the common signal line 420, the first signal line 510 and the second signal line 520 are all located between the first fanout region 541 and the second fanout region 542.

For example, the common signal line 420 is located between two integrated circuits. For example, both the first pads 110 and the second pads 210 are located between the first fanout region 541 and the second fanout region 542.

In some examples, as illustrated in FIG. 10 and FIG. 11, the display panel further includes an electrostatic discharge structure 8300 electrically connected to the connection line 540, and located between the signal transmission line 530 and the first pad region 100 and between the signal transmission line 530 and the second pad region 200. For example, the electrostatic discharge structure 8300 is located between the signal transmission line 530 and the second dummy structure group 820. For example, the electrostatic discharge structure 8300 is located between the signal transmission line 530 and the first fanout region 541 and between the signal transmission line 530 and the second fanout region 542. Optionally, the electrostatic discharge structure includes a plurality of transistors, the plurality of transistors are electrically connected to each other, one end of the electrostatic discharge structure is electrically connected to the data line of the display panel, and the other end of the electrostatic discharge structure is connected to a common electrode line or an electrostatic discharge ring, which is not limited thereto.

In some examples, as illustrated in FIG. 6 and FIG. 7, the plurality of fourth pads 610 and the plurality of fifth pads 710 both include a plurality of first signal output pads 671 and a plurality of second signal output pads 672, and the plurality of first signal output pads 671 and the plurality of second signal output pads 672 are located in different layers; and the plurality of first signal output pads 671 and the plurality of second signal output pads 672 are arranged in a plurality of rows of output pad rows 670, each row of output pad rows 670 includes the first signal output pads 671 and the second signal output pads 672 arranged alternately along the second direction, and adjacent rows of output pad rows 670 are offset with respect to each other in the second direction. For example, the ratio of the shifted dimension of the adjacent rows of output pad rows 670 in the second direction to the pitch of one pad is 0.5-1.5, or 0.6-1.4, or 0.7-1.3, or 0.8-1.2, or 0.9-1.1.

By providing the pads of the fourth pads and the fifth pads as output pads located in different layers, it is beneficial to improve the compactness of arrangement of pads and reduce the interference between pads provided in the same layer; and distributing the adjacent rows of output pad rows in a shifted manner in the second direction can facilitate providing of positions of connection lines connected to respective pads in the output pad row.

For example, as illustrated in FIG. 6 and FIG. 7, a plurality of first signal output pads 671 and a plurality of second signal output pads 672 included in the fourth pads 610 are arranged into three output pad rows 670; a connection line 540 electrically connected to a pad in the second output pad row 670 passes through an interval between the first signal output pad 671 and the second signal output pad 672 provided adjacent to each other in the first output pad row 670; and a connection line 540 electrically connected to a pad in the third output pad row 670 passes through the interval between the first signal output pad 671 and the second signal output pad 672 provided adjacent to each other in the first output pad row 670, and an interval between the first signal output pad 671 and the second signal output pad 672 provided adjacent to each other in the second output pad row 670.

For example, one of the first signal output pad 671 and the second signal output pad 672 is provided in the same layer as the data line, and the other of the first signal output pad 671 and the second signal output pad 672 is provided in the same layer as the gate line.

In some examples, as illustrated in FIG. 6 and FIG. 7, the plurality of connection lines 540 include a plurality of first connection lines 543 electrically connected to the plurality of first signal output pads 671 and a plurality of second connection lines 544 electrically connected to the plurality of second signal output pads 672, the plurality of first connection lines 543 are provided in the same layer as the plurality of first signal output pads 671, the plurality of second connection lines 544 are provided in the same layer as the plurality of second signal output pads 672, and the plurality of first connection lines 543 and the plurality of second connection lines 544 are arranged alternately along the second direction.

For example, the first connection lines 543 provided in the same layer as the first signal output pads 671 are formed in the same patterning process as the first signal output pads 671, and the second connection lines 544 provided in the same layer as the second signal output pads 672 are formed in the same patterning process as the second signal output pads 672.

Figure 14:
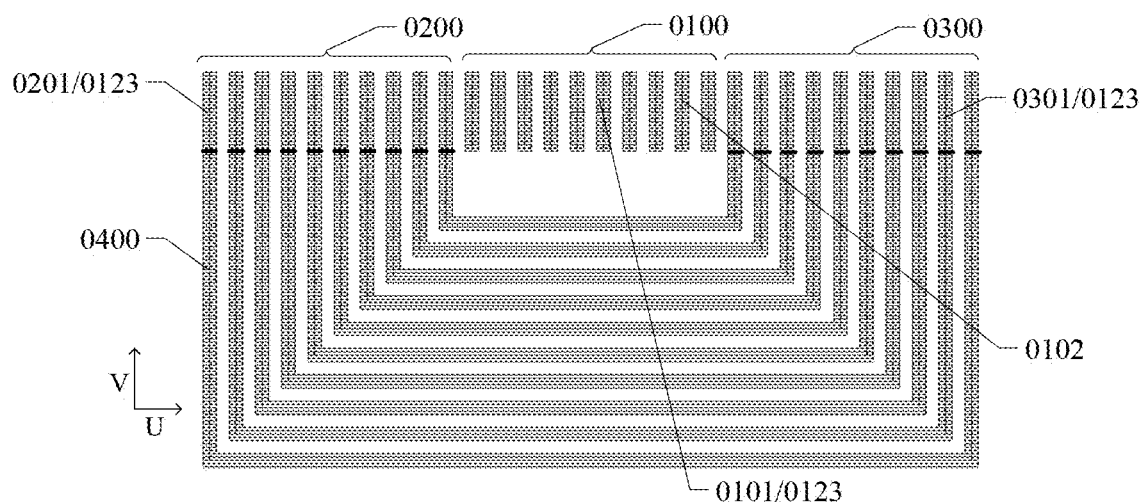
FIG. 14 is a schematic view of a partial structure of a circuit board according to another embodiment of the present disclosure.

FIG. 14 is a schematic view of a partial structure of a circuit board according to another embodiment of the present disclosure. As illustrated in FIG. 14, the circuit board includes a first pin region 0100, a second pin region 0200 and a third pin region 0300 arranged along the first direction, and the second pin region 0200 and the third pin region 0300 are located on both sides of the first pin region 0100; each pin region includes a plurality of pins; and the circuit board further includes at least one connection lead 0400, and at least one pin 0201 in the second pin region 0200 is electrically connected to at least one pin 0301 in the third pin region 0300 through at least one connection lead 0400. For example, N pins 0201 in the second pin region 0200 are electrically connected to N pins 0301 in the third pin region 0300 in a one-to-one correspondence through N connection leads 0400.

The circuit board provided by the present disclosure can be cooperated with the above-mentioned display panel by electrically connecting at least one pin in the second pin region to at least one pin in the third pin region through at least one connection lead, so as to electrically connect the first signal line in the display panel to the second signal line, so that the display panel has a better display effect.

Figure 15:
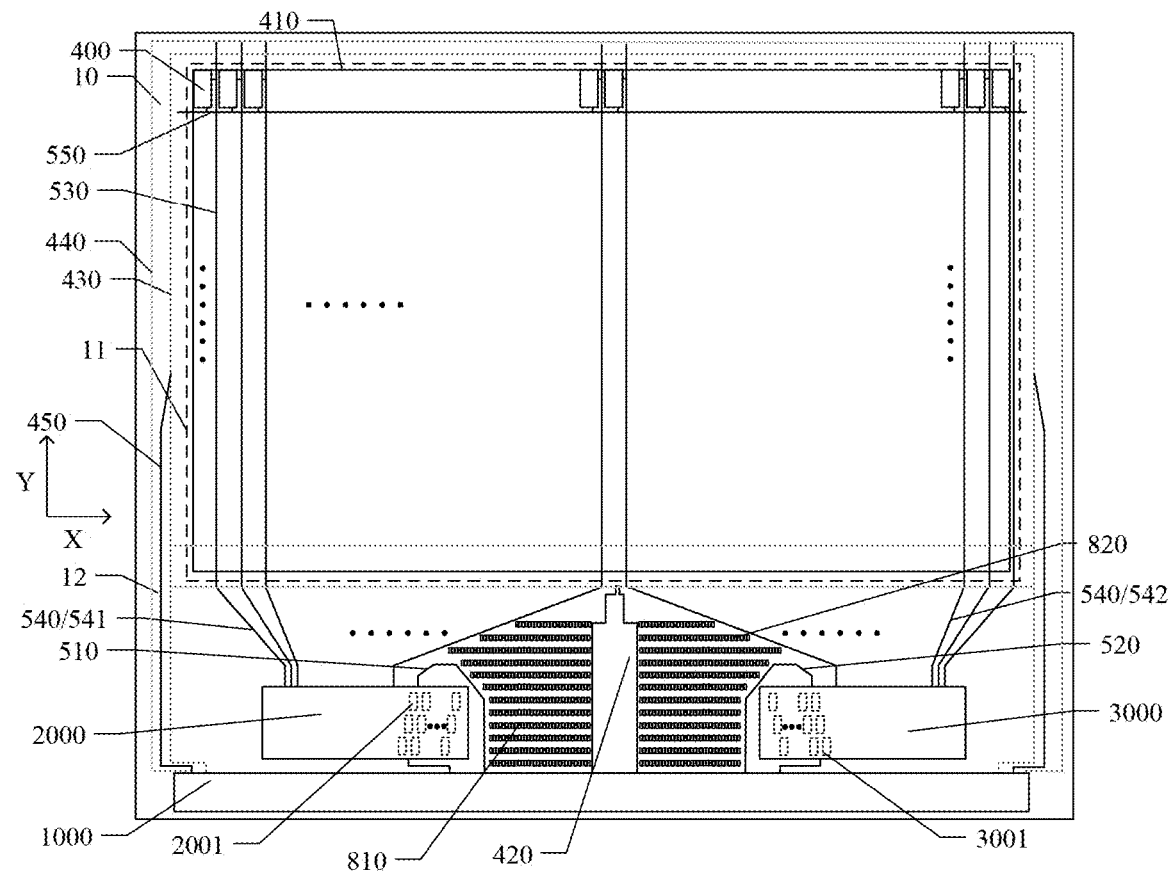
FIG. 15 is a schematic view of a partial structure of a display device according to yet another embodiment of the present disclosure.

FIG. 15 is a schematic view of a partial structure of a display device according to yet another embodiment of the present disclosure. As illustrated in FIG. 15, the display device includes the display panel illustrated in any one of FIG. 2-FIG. 13 and a circuit board 1000, for example, the circuit board 1000 is the circuit board illustrated in FIG. 14.

As illustrated in FIG. 15, the circuit board 1000 includes at least one connection lead 0400, and a first pin region 0100, a second pin region 0200 and a third pin region 0300 arranged along the second direction, the second pin region 0200 and the third pin region 0300 are located on both sides of the first pin region 0100, and each pin region includes a plurality of first pins 0123; and at least one first pin 0123 in the second pin region 0200 is electrically connected to at least one first pin 0123 in the third pin region 0300 through the at least one connection lead 0400. A first portion 311 of the third pad 310 is bound to the first pin 0123 of the first pin region 0100, a second portion 312 of the third pad 310 is bound to the first pin 0123 of the second pin region 0200, and a third portion 313 of the third pad 310 is bound to the first pin 0123 of the first pin region 0100.

In the display device provided by the embodiments of the present disclosure, the first signal line and the second signal line in the display panel are electrically connected to each other through a circuit board, thereby avoiding electrostatic breakdown between the first signal line and the common signal line, and the second signal line and the common signal line without additionally increasing the manufacturing cost of the display panel.

For example, as illustrated in FIG. 14, the first pin region 0100, the second pin region 0200 and the third pin region 0300 are arranged along the U direction. For example, the U direction in FIG. 14 is the same as the second direction illustrated in FIG. 2, but is not limited thereto.

For example, as illustrated in FIG. 14, the first pin region 0100 includes a plurality of pins 0101, the second pin region 0200 includes a plurality of pins 0201, and the third pin region 0300 includes a plurality of pins 0301.

For example, as illustrated in FIG. 2-FIG. 15, the pins 0101 in the first pin region 0100 are configured to be bound to the third portion 313 of the third pad 310 to achieve that the circuit board provides a common signal to the common signal line 420.

In some examples, as illustrated in FIG. 14, the connection lead 0400 is configured to transmit at least one of a synchronization signal and a gamma signal.

For example, as illustrated in FIG. 2-FIG. 15, the first signal line 510 is electrically connected to the second signal line 520 through the first portion 311 of the third pads 310, the pin 0201 in the second pin region 0200, the connection lead 0400, the pin 0301 in the third pin region 0300, and the second portion 312 of the third pads 310.

In some examples, as illustrated in FIG. 15, the display device further includes a first integrated circuit 2000 and a second integrated circuit 3000, the first integrated circuit 2000 includes at least one second pin 2001, and the second integrated circuit 3000 includes at least one third pin 3001. At least one second pin 2001 is bound to at least one first pad 110, and at least one third pin 3001 is bound to at least one second pad 210.

For example, the first signal line 510 is electrically connected to the first integrated circuit 2000 through the third pad 310, and the second signal line 520 is electrically connected to the second integrated circuit 3000 through the third pad 310.

For example, as illustrated in FIG. 2-FIG. 15, the synchronization signal lines that need to be connected between the first integrated circuit 2000 and the second integrated circuit 3000, that is, the first signal line 510 and the second signal line 520 are respectively connected to the circuit board (FPC) at the glass end from the left end and the right end of the common signal line 420, and the synchronization signal lines on the display panel are not connected to each other, so that the common signal line can be avoided from crossing the synchronization signal lines; and in order to achieve the normal display of the display panel, it is still necessary to connect the synchronization signal lines of the first integrated circuit 2000 and the second integrated circuit 3000, for example, the synchronization signal lines transmitting the same signal are electrically connected together through leads on a flexible printed circuit assembly (FPCA). For example, after respective integrated circuits are bound to the circuit board, the connection between the first signal line and the second signal line between the first integrated circuit and the second integrated circuit is achieved through the leads on the circuit board, so that the display panel can display normally.

For example, as illustrated in FIG. 14, the total number of pins 0101 included in the first pin region 0100 is less than the total number of pins 0201 included in the second pin region 0200, or the total number of pins 0101 included in the first pin region 0100 is less than the total number of pins 0301 included in the third pin region 0300. For example, the total number of the pins 0201 is the same as the total number of the pins 0301.

For example, as illustrated in FIG. 14, the pins 0101, 0201, and 0301 have the same shape and dimension. For example, a plurality of pins 0101, a plurality of pins 0201 and a plurality of pins 0301 are arranged at equal intervals in the U direction.

For example, the total number of pins 0101 is two, for example, two pins 0101 are bound to four third pads 310 on the display panel.

For example, as illustrated in FIG. 2-FIG. 14, the first pin region 0100 further includes dummy pins 0102, and the dummy pins 0102 are bound to the first dummy pads 320.

For example, as illustrated in FIG. 14, the pin 0101 is located in the middle of the first pin region 0100, and the dummy pins 0102 are located on both sides of the pin 0101. For example, some of the dummy pins 0102 are located between the pin 0101 and the pin 0201, and some other of the dummy pins 0102 are located between the pin 0101 and the pin 0301.

In some examples, as illustrated in FIG. 14, the connection leads 0400 are distributed symmetrically relative to the first lead region 0100 to prevent different connection leads from intersecting with each other.

For example, as illustrated in FIG. 14, different connection leads 0400 are provided in the same layer. For example, the connection lead 0400 and the first pin 0123 are provided in the same layer. For example, the connection lead 0400 and the first pin 0123 connected thereto are formed as an integral structure.

For example, FIG. 14 schematically illustrates 10 connection leads 0400, and these 10 connection leads are electrically connected to the signal lines 511 for transmitting the SYNC signal illustrated in FIG. 6. For example, the connection lead 0400 further includes a partial lead electrically connected to the signal line 512 for transmitting the Gamma signal illustrated in FIG. 6.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

The invention claimed is:

1. A display panel, comprising:
 a base substrate, comprising a display region and a peripheral region;
 a first pad region, located in the peripheral region and comprising at least one first pad, wherein the at least one first pad is configured to be electrically connected to a first integrated circuit;
 a second pad region, located in the peripheral region and comprising at least one second pad, wherein the at least one second pad is configured to be electrically connected to a second integrated circuit;
 a third pad region, located in the peripheral region and comprising a plurality of third pads, wherein the plurality of third pads are configured to be electrically connected to a circuit board, and the third pad region is located on a side of the first pad region and the second pad region away from the display region;
 a plurality of sub-pixels, located in the display region, wherein the plurality of sub-pixels comprises a common electrode;
 a common signal line, electrically connected to the common electrode, wherein the common signal line is located in the peripheral region and extends along a first direction, the first pad region and the second pad region are located on both sides of the common signal line in a second direction, and the first direction intersects with the second direction,
 wherein the display panel further comprises at least one first signal line and at least one second signal line, the at least one first pad is electrically connected to a first portion of the plurality of third pads through the at least one first signal line, the at least one second pad is electrically connected to a second portion of the plurality of third pads through the at least one second signal line, and the common signal line is electrically connected to an output terminal of the circuit board through a third portion of the plurality of third pads; and
 the at least one first signal line and the at least one second signal line are configured to be electrically connected to each other through the circuit board and the third pads.

2. The display panel according to claim 1, wherein, in a direction perpendicular to the base substrate, both the at least one first signal line and the at least one second signal line do not overlap with the common signal line.

3. The display panel according to claim 1, wherein a signal configured to be transmitted on a first signal line and a signal configured to be transmitted on a second signal line corresponding to the first signal line are the same signal, and the same signal comprises at least one of a synchronization signal and a gamma signal.

4. The display panel according to claim 1, wherein at least one kind of the at least one first signal line and the at least one second signal line is provided in the same layer as the common signal line and is insulated from the common signal line.

5. The display panel according to claim 1, wherein at least one signal line of the at least one first signal line and the at least one second signal line comprises a signal line portion extending along the second direction and a signal line portion extending along a third direction, a line width of the signal line portion extending along the second direction is smaller than a line width of the signal line portion extending along the third direction, and both the first direction and the second direction intersect with the third direction.

6. The display panel according to claim 1, wherein a first dummy structure group is provided between the common signal line and at least one kind of the at least one first signal line and the at least one second signal line; and
 a straight line extending along the second direction passes through orthographic projections of at least one kind of signal line of the at least one first signal line and the at least one second signal line, the first dummy structure group, and the common signal line on the base substrate.

7. The display panel according to claim 6, wherein, in a direction perpendicular to the base substrate, all of the first signal line, the second signal line and the common signal line do not overlap with the first dummy structure group.

8. The display panel according to claim 6, wherein the first dummy structure group comprises a plurality of first dummy structure rows arranged along the first direction, and each first dummy structure row comprises a plurality of first dummy structures arranged along the second direction.

9. The display panel according to claim 6, wherein a maximum length of a portion of at least one kind of the at least one first signal line and the at least one second signal line extending along the second direction is smaller than a maximum dimension of the first dummy structure group in the second direction.

10. The display panel according to claim 6, wherein a second dummy structure group is provided between the first dummy structure group and the display region; and a straight line extending along the second direction passes through orthographic projections of the second dummy structure group and the common signal line on the base substrate, and the straight line does not pass through orthographic projections of the first signal line and the second signal line on the base substrate.

11. The display panel according to claim 1, wherein a plurality of first dummy pads is provided between the third pad electrically connected to the common signal line and the third pad electrically connected to the first signal line, and provided between the third pad electrically connected to the common signal line and the third pad electrically connected to the second signal line.

12. A display device, comprising:

a display panel according to claim 1; and a circuit board, comprising at least one connection lead, and a first pin region, a second pin region and a third pin region arranged along the second direction, wherein the second pin region and the third pin region are located on both sides of the first pin region, and each pin region comprises a plurality of first pins; at least one first pin in the second pin region is electrically connected to at least one first pin in the third pin region through the at least one connection lead;

wherein the first portion of the third pads is bound to the first pin of the first second pin region, the second portion of the third pads is bound to the first pin of the second third pin region, and a third portion of the third pad is bound to the first pin of the first pin region.

13. The display device according to claim 12, further comprising:

a first integrated circuit, comprising at least one second pin; and a second integrated circuit, comprising at least one third pin, wherein the at least one second pin is bound to the at least one first pad, and the at least one third pin is bound to the at least one second pad.

14. The display panel according to claim 1, further comprising:

a plurality of signal transmission lines, electrically connected to at least part of the plurality of sub-pixels;

a fourth pad region, located on a side of the first pad region away from the common signal line and comprising a plurality of fourth pads, wherein the plurality of fourth pads is configured to electrically connect an output terminal of the first integrated circuit to at least part of the plurality of signal transmission lines; and a fifth pad region, located on a side of the second pad region away from the common signal line and comprising a plurality of fifth pads, wherein the plurality of fifth pads is configured to electrically connect an output terminal of the second integrated circuit to at least part of the plurality of signal transmission lines, wherein a fourth portion of the plurality of third pads is configured to electrically connect an input terminal of the first integrated circuit to the output terminal of the circuit board, and a fifth portion of the plurality of third pads is configured to electrically connect an input terminal of the second integrated circuit to the output terminal of the circuit board.

15. The display panel according to claim 14, wherein the plurality of signal transmission lines comprise a data line.

16. The display panel according to claim 14, further comprising:

a plurality of connection lines, located in the peripheral region and configured to electrically connect at least part of the signal transmission lines to the plurality of fourth pads, and electrically connect at least part of the signal transmission lines to the plurality of fifth pads, wherein a part of the plurality of connection lines connected to the plurality of fourth pads forms a first fanout region, a part of the plurality of connection lines connected to the plurality of fifth pads forms a second fanout region, and the common signal line, the first signal line and the second signal line are all located between the first fanout region and the second fanout region.

17. The display panel according to claim 16, further comprising an electrostatic discharge structure, wherein the electrostatic discharge structure is electrically connected to the connection line, and the electrostatic discharge structure is located between the signal transmission line and the first pad region and between the signal transmission line and the second pad region.

18. The display panel according to claim 16, wherein the plurality of fourth pads and the plurality of fifth pads both comprise a plurality of first signal output pads and a plurality of second signal output pads, and the plurality of first signal output pads and the plurality of second signal output pads are located in different layers; and the plurality of first signal output pads and the plurality of second signal output pads are arranged in a plurality of rows of output pad rows, each row of the output pad rows comprises the first signal output pads and the second signal output pads arranged alternately along the second direction, and adjacent rows of output pad rows are offset with respect to each other in the second direction.

19. A circuit board, comprising:

a first pin region, a second pin region and a third pin region arranged along a first direction, the second pin region and the third pin region being located on both sides of the first pin region, and each pin region comprising a plurality of pins;

wherein the circuit board further comprises at least one connection lead, and at least one pin in the second pin region is electrically connected to at least one pin in the third pin region through the at least one connection lead;

the connection lead only connects the pin in the second pin region and the pin in the third pin region.

20. The circuit board according to claim 19, wherein the connection lead is configured to transmit at least one of a synchronization signal and a gamma signal.

\* \* \* \* \*